United States Patent
You et al.

(10) Patent No.: US 10,074,726 B2
(45) Date of Patent: Sep. 11, 2018

(54) FIN SEMICONDUCTOR DEVICE INCLUDING DUMMY GATE ON ISOLATION LAYER

(71) Applicants: Jung-Gun You, Ansan-si (KR); Young-Joon Park, Seoul (KR); Ji-Yong Ha, Seoul (KR)

(72) Inventors: Jung-Gun You, Ansan-si (KR); Young-Joon Park, Seoul (KR); Ji-Yong Ha, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/710,776

(22) Filed: May 13, 2015

(65) Prior Publication Data

US 2016/0190271 A1    Jun. 30, 2016

(30) Foreign Application Priority Data

Dec. 24, 2014 (KR) .................. 10-2014-0188584

(51) Int. Cl.
*H01L 27/088* (2006.01)
*H01L 29/423* (2006.01)
*H01L 29/78* (2006.01)
*H01L 29/06* (2006.01)
*H01L 29/49* (2006.01)
*H01L 29/51* (2006.01)
(Continued)

(52) U.S. Cl.
CPC .... *H01L 29/42376* (2013.01); *H01L 27/0207* (2013.01); *H01L 27/0886* (2013.01); *H01L 29/0649* (2013.01); *H01L 29/4916* (2013.01); *H01L 29/518* (2013.01); *H01L 29/7851* (2013.01); *H01L 21/823431* (2013.01); *H01L 21/823437* (2013.01); *H01L 21/823456* (2013.01)

(58) Field of Classification Search
CPC ........... H01L 29/42376; H01L 29/0649; H01L 29/4916; H01L 29/518; H01L 29/7851; H01L 27/0886; H01L 27/0207
See application file for complete search history.

(56) References Cited

U.S. PATENT DOCUMENTS

| | | |
|---|---|---|
| 5,523,245 A | 6/1996 | Imai |
| 6,413,802 B1 | 7/2002 | Hu et al. |
| 6,844,602 B2 | 1/2005 | Kwon |

(Continued)

FOREIGN PATENT DOCUMENTS

JP     2005-093530 A     4/2005

*Primary Examiner* — Matthew Gordon
(74) *Attorney, Agent, or Firm* — Harness, Dickey & Pierce, P.L.C.

(57) ABSTRACT

A semiconductor device and a method of manufacturing a semiconductor device, the device including an active fin protruding from a substrate and extending in a first direction, a first device isolation region disposed at a sidewall of the active fin and extending in a second direction, the second direction crossing the first direction, a normal gate electrode crossing the active fin, a first dummy gate electrode having an undercut portion on the first device isolation region, the first dummy gate electrode extending in the second direction, and a first filler filling the undercut portion on the first device isolation region, wherein the undercut portion is disposed at a lower portion of the first dummy gate electrode.

20 Claims, 27 Drawing Sheets

(51) Int. Cl.
*H01L 27/02* (2006.01)
*H01L 21/8234* (2006.01)

(56) References Cited

U.S. PATENT DOCUMENTS

| | | |
|---|---|---|
| 8,435,846 B2 | 5/2013 | Cheng et al. |
| 8,592,266 B2 | 11/2013 | Li et al. |
| 8,617,956 B2 | 12/2013 | Doris et al. |
| 8,637,359 B2 | 1/2014 | Chang et al. |
| 8,803,241 B2 | 8/2014 | Lin et al. |
| 2002/0179962 A1* | 12/2002 | Kinoshita ......... H01L 27/11521 257/315 |
| 2011/0147812 A1* | 6/2011 | Steigerwald ...... H01L 21/28123 257/288 |
| 2013/0187206 A1* | 7/2013 | Mor ................. H01L 29/66628 257/288 |
| 2013/0292747 A1 | 11/2013 | Kang |
| 2014/0110784 A1 | 4/2014 | Jagannathan et al. |
| 2014/0138780 A1 | 5/2014 | Colinge et al. |
| 2014/0148000 A1 | 5/2014 | Barletta |
| 2014/0159142 A1 | 6/2014 | Lim et al. |
| 2014/0175527 A1 | 6/2014 | Chang et al. |
| 2014/0183631 A1 | 7/2014 | Hao et al. |
| 2014/0183642 A1 | 7/2014 | Liang et al. |
| 2014/0191299 A1 | 7/2014 | Wang et al. |
| 2014/0193947 A1 | 7/2014 | Yamazaki |
| 2014/0197468 A1 | 7/2014 | Xie et al. |
| 2014/0203333 A1 | 7/2014 | Huang et al. |
| 2015/0206885 A1* | 7/2015 | Barth, Jr. .......... H01L 27/10826 257/301 |
| 2016/0099181 A1* | 4/2016 | Tung ................ H01L 21/82382 257/369 |

\* cited by examiner

14

1200

1300

1400

FIN SEMICONDUCTOR DEVICE INCLUDING DUMMY GATE ON ISOLATION LAYER

CROSS-REFERENCE TO RELATED APPLICATIONS

This U.S. non-provisional patent application claims priority under 35 U.S.C. § 119 to Korean Patent Application No. 10-2014-0188584 filed on Dec. 24, 2014 in the Korean Intellectual Property Office (KIPO), the contents of which are herein incorporated by reference in their entirety.

TECHNICAL FIELD

Example embodiments of the present inventive concepts relate to a semiconductor device having filler and/or a method of manufacturing the same.

DISCUSSION OF RELATED ART

Recently, semiconductor devices have been developed to perform high-speed operations at low voltages and to be highly integrated. Multi-gate transistors have been proposed as a method of scaling down the density of the semiconductor devices by forming an active fin on a semiconductor substrate.

Furthermore, there has been an increased interest in fin field effect transistors (FinFETs) having a three-dimensional channel structure in order to decrease effectively short channel effect (SCE) better than conventional transistors and to provide higher driving current at a lower voltage.

SUMMARY

Example embodiments of the inventive concepts provide semiconductor devices capable of improving reliability and methods of manufacturing the same.

In an example embodiment of the present inventive concepts, a semiconductor device may include an active fin protruding from a substrate and extending in a first direction, a first device isolation region disposed at a sidewall of the active fin and extending in a second direction, the second direction crossing the first direction, a normal gate electrode crossing the active fin, a first dummy gate electrode having an undercut portion on the first device isolation region, the first dummy gate electrode extending in the second direction and a first filler filling the undercut portion on the first device isolation region, wherein the undercut portion is disposed at a lower portion of the first dummy gate electrode.

In example embodiments, the first device isolation region may have a first upper surface and a second upper surface having a lower level than the first upper surface, and the first dummy gate electrode may be disposed on the second upper surface.

In example embodiments, the first upper surface of the first device isolation region may be disposed beside the active fin, and the second upper surface of the first device isolation region may be disposed at a center portion of the first device isolation region.

In example embodiments, the semiconductor device may further comprise a second device isolation region disposed at a sidewall of the active fin and extending in the second direction, the second device isolation region may be opposite to the first device isolation region with the active fin therebetween and has an upper surface higher than that of the first device isolation region.

In example embodiments, the semiconductor device may further comprise a second dummy gate electrode having an undercut portion on the second device isolation region, the second dummy gate electrode extending in the second direction, and a second filler filling the undercut portion of the second dummy gate electrode on the second device isolation region.

In example embodiments, a bottom surface of the second device isolation region may be lower than that of the first device isolation region.

In example embodiments, a bottom surface of the second device isolation region may be lower than that of the active fin.

In example embodiments, the active fin may comprise a first active fin and a second active fin extended in parallel with the first active fin, the first and second active fins being spaced apart from each other at a distance, wherein a length of a long side of the first active fin may be greater than a length of a long side of the second active fin, and wherein the second dummy gate electrode overlaps the first active fin, but not overlaps the second active fin.

In example embodiments, the active fin may comprise a first active fin and a second active fin, the first and second active fins being spaced apart from each other at a distance, wherein a length of a long side of the first active fin may be greater than a length of a long side of the second active fin, and wherein the second device isolation region may be adjacent to the long side of the first active and to a short side of the second active fin.

In example embodiments, the semiconductor device may further comprise a dummy spacer disposed at a sidewall of the first dummy gate electrode, wherein the first filler may have a material having an etch selectivity with respect to the dummy spacer.

In example embodiments, the first dummy gate electrode may comprise a polysilicon gate electrode having the undercut portion and a mask layer pattern disposed on the polysilicon gate electrode.

In example embodiments, the active fin has a first upper surface and a second upper surface having a lower level than the first upper surface, and wherein the normal gate electrode may be disposed at the second upper surface of the active fin.

In another example embodiment of the present inventive concepts, a semiconductor device may include an active fin protruding from a substrate and extending in a direction, a device isolation region disposed at a sidewall of the active fin, a normal gate electrode crossing the active fin, a normal spacer disposed at a sidewall of the normal gate electrode, a gate dielectric layer disposed along a bottom surface of the normal gate electrode and along a sidewall of the normal spacer, a filler pattern disposed between the gate dielectric layer and the normal gate electrode, and a dummy gate electrode on the device isolation region.

In example embodiments, the filler pattern may extend upward along the sidewall of the normal spacer.

In example embodiments, the filler pattern may comprise a silicon oxynitride layer.

In example embodiments, the active fin may have a first upper surface and a second upper surface having a lower level than the first upper surface, and the normal gate electrode is disposed at the second upper surface of the active fin.

In example embodiments, the first upper surface of the active fin may be adjacent to the device isolation region, and the second upper surface of the active fin may be disposed at a center portion of the active fin.

In example embodiments, the semiconductor device may further comprise a filler on the device isolation region, wherein the dummy gate electrode may have an undercut portion disposed at a lower portion of the dummy gate electrode, and wherein the filler may fill the undercut portion.

In example embodiments, the active fin may comprise a first active fin and a second active fin extended in parallel with the first active fin, the first and second active fins being spaced apart from each other at a distance, and wherein the dummy gate electrode overlaps the first active fin, but not overlaps the second active fin.

In example embodiments, an upper surface of the device isolation region may have a higher level than an upper surface of the active fin.

In example embodiments, a bottom surface of the device isolation region may have a lower level than a bottom surface of the active fin.

In an example embodiment of the present inventive concepts, a semiconductor device may include an active fin protruding from a substrate and extending in a first direction, a device isolation region disposed at a sidewall of the active fin and extended in a second direction, the second direction crossing the first direction, a field insulating region disposed at a long side of the active fin, the field insulating region comprising a first upper surface and a second upper surface having a lower level than the first upper surface, a normal gate electrode on the second upper surface of the field insulating region, the normal gate crossing the active fin, a normal spacer disposed at a sidewall of the normal gate electrode, a gate dielectric layer disposed along a bottom surface of the normal gate electrode and along a sidewall of the normal spacer, and a filler pattern disposed between the gate dielectric layer and the normal gate electrode.

In example embodiments, the first upper surface of the field insulating region may have a lower level than an upper surface of the device isolation region.

In example embodiments, the first upper surface of the field insulating region may be adjacent to a short side of the active fin, and the second upper surface of the field insulating region may be adjacent to a center portion of the active fin.

In example embodiments, the device isolation region may extend along a short side of the active fin, and the field insulating region may extend along a long side of the active fin.

In example embodiments, the semiconductor device may further comprise a dummy gate electrode on the device isolation region, the dummy gate electrode having an undercut portion disposed at a lower portion thereof, and a filler filling the undercut portion on the device isolation region.

In an example embodiment of the present inventive concepts, a method of manufacturing a semiconductor device may include forming an active fin protruding from a substrate, the active fin extending in a first direction, forming a device isolation region at a sidewall of the active fin and extended in a second direction, the second direction crossing the first direction, forming a first dummy gate electrode on the active fin, forming a second dummy gate electrode on the device isolation region, forming a filler on sidewalls of the first and second dummy gate electrodes, and replacing the first dummy gate electrode to a first metal gate electrode.

In example embodiments, the method may further comprise forming an undercut portion at a lower portion of the first dummy gate electrode or the second dummy gate electrode, wherein the filler fills the undercut portion of the first dummy gate electrode or the second dummy gate electrode.

In example embodiments, the method of replacing the first dummy gate electrode to a first metal gate electrode may comprise forming spacers at both sides of the first dummy gate electrode, removing the first dummy gate electrode and the filler formed on the sidewall of the first dummy gate electrode, and forming a metal gate electrode between the spacers.

In example embodiments, the method of removing the filler may comprise removing a portion of the filler to form a filler pattern on sidewalls of the spacers.

In example embodiments, the method of replacing the first dummy gate electrode to a first metal gate electrode may comprise removing a portion of the filler to form a filler pattern, and forming a first metal gate electrode adjacent to the filler pattern.

In example embodiments, the method may further comprise replacing the second dummy gate electrode with a second metal gate electrode, and removing a portion of the filler to form a filler pattern adjacent to the second metal gate electrode.

In example embodiments, the filler may comprise a silicon oxynitride layer.

In example embodiments, the method of forming the filler may comprise forming a first filler on sidewalls of the first and second dummy gate electrodes, and forming a second filler on the first filler. The second filler may comprise a material different from a material of the first filler.

BRIEF DESCRIPTION OF THE DRAWINGS

The foregoing and other features and advantages of this disclosure will be apparent from the more particular description of the example embodiments, as illustrated in the accompanying drawings in which like reference characters refer to the same parts throughout the different views. The drawings are not necessarily to scale, emphasis instead being placed upon illustrating the principles of the disclosed embodiments.

DETAILED DESCRIPTION

Figure 1:
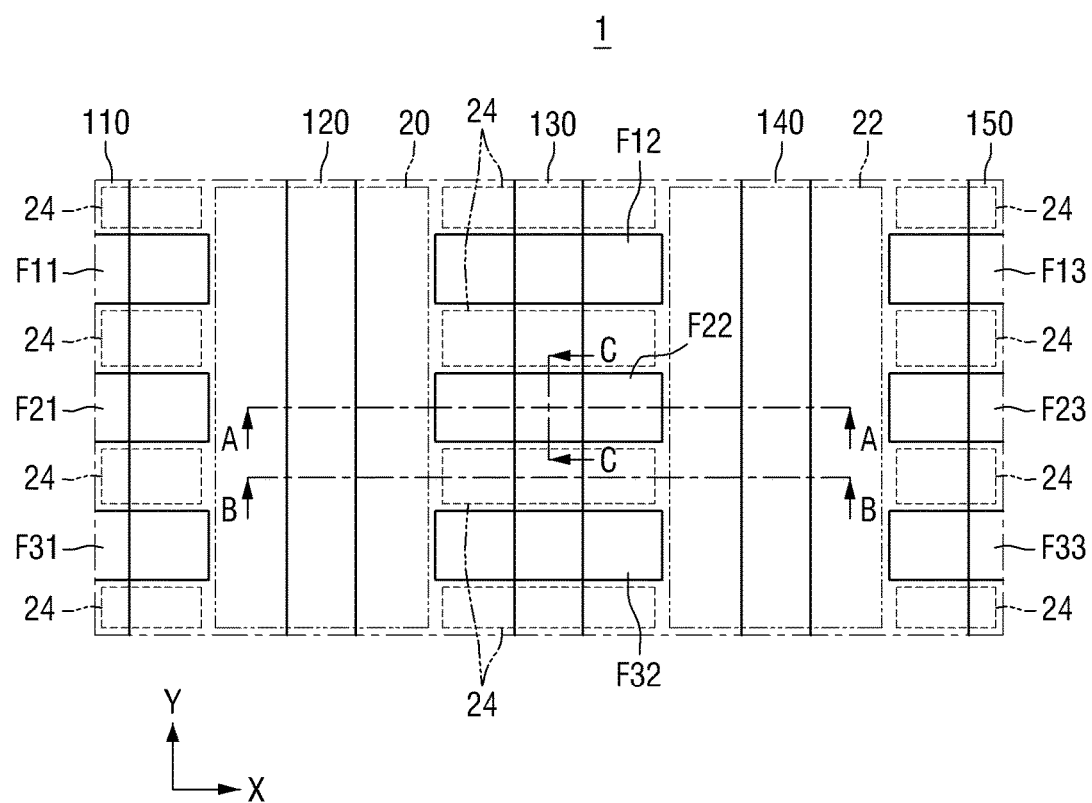
FIG. 1 is a layout illustrating a semiconductor device according to an example embodiment of the inventive concepts.

Example embodiments of the inventive concepts will now be described more fully hereinafter with reference to the accompanying drawings; however, they may be embodied in different forms and should not be construed as limited to the example embodiments set forth herein.

It will be understood that when an element is referred to as being "on," "connected" or "coupled" to another element, it can be directly on, connected or coupled to the other element or intervening elements may be present. In contrast, when an element is referred to as "contacting," or being "directly on," "directly connected" or "directly coupled" to another element, there are no intervening elements present. Other words used to describe the relationship between elements or layers should be interpreted in a like fashion (e.g., "between" versus "directly between," "adjacent" versus "directly adjacent," "under" versus "directly under").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or example terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of the inventive concepts will be described in detail with reference to the accompanying drawings.

Figure 2A:
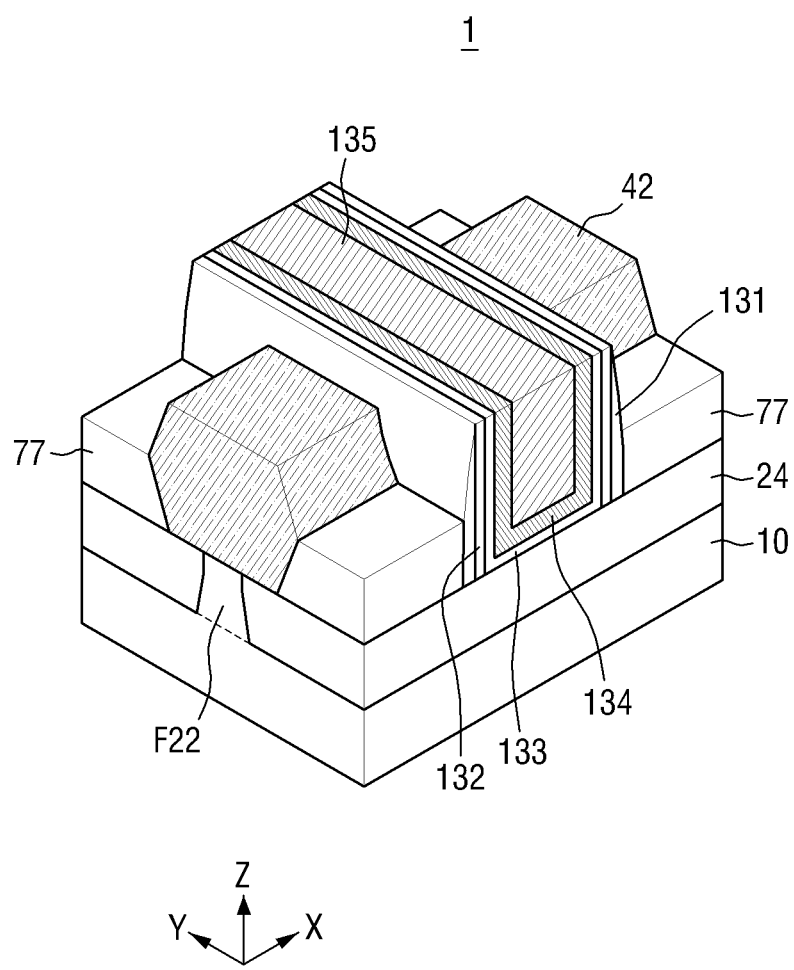
FIG. 2a is a perspective view illustrating a normal gate in FIG. 1.
Figure 2B:
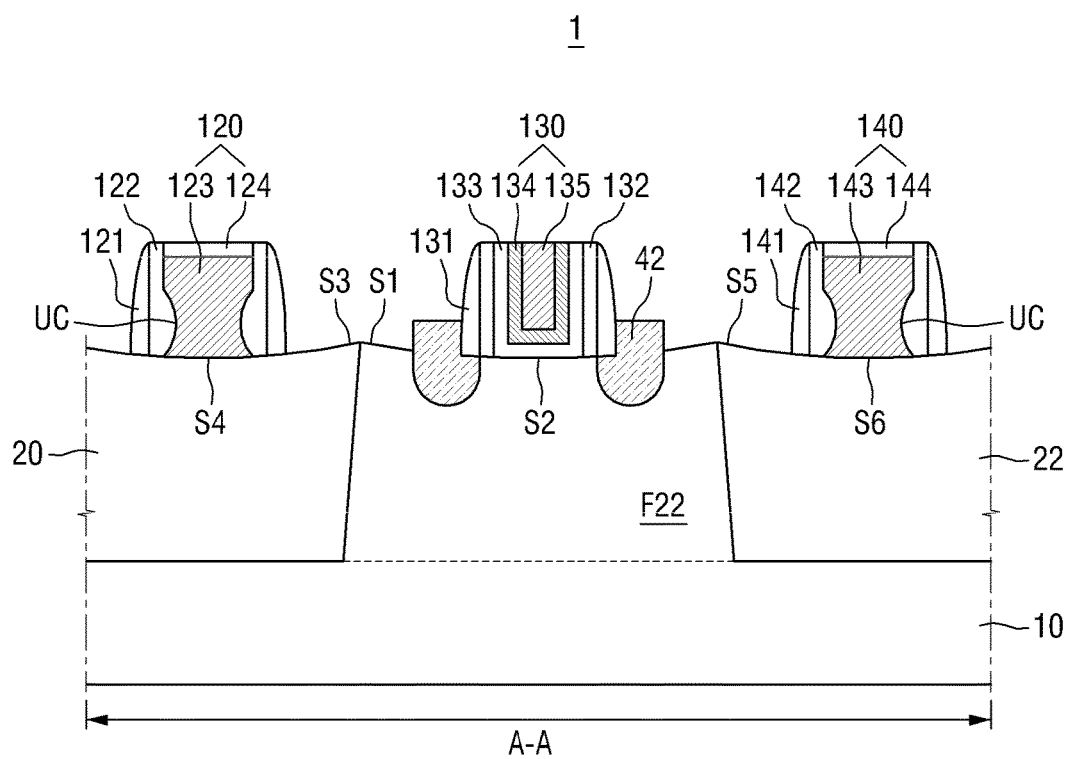
FIG. 2b is a cross-sectional view according to line A-A of FIG. 1.
Figure 3:
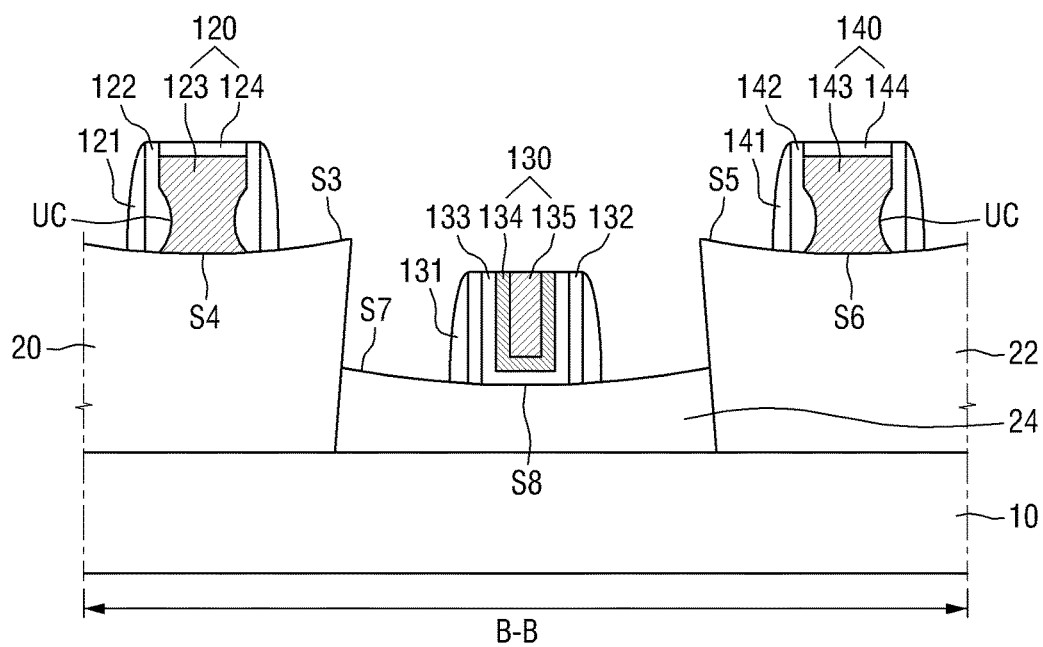
FIG. 3 is a cross-sectional view according to line B-B of FIG. 1.
Figure 4:
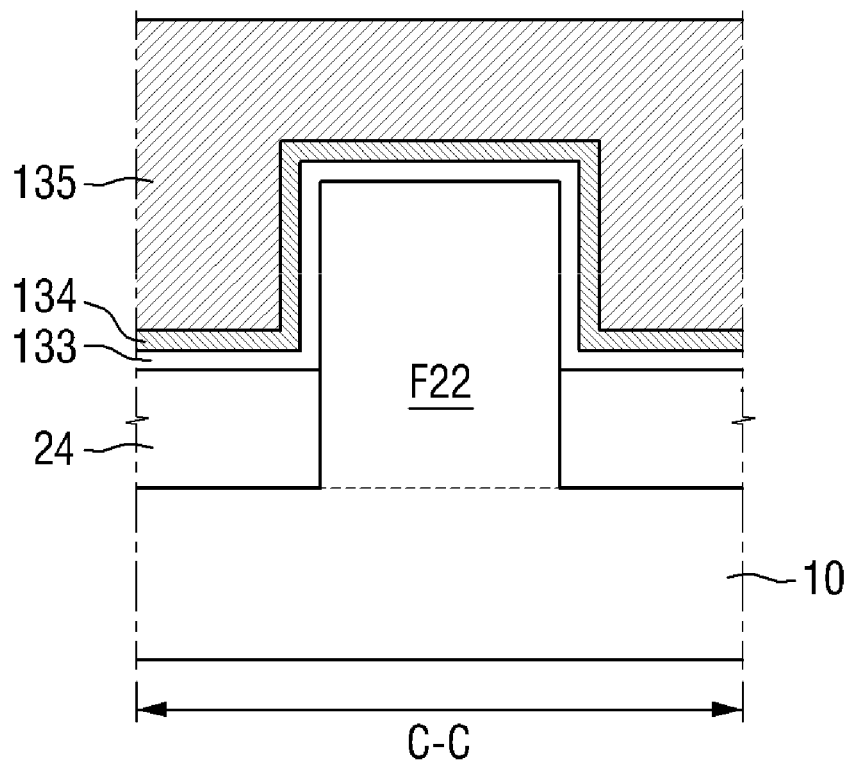
FIG. 4 is a cross-sectional view according to line C-C of FIG. 1.

FIG. 1 is a layout illustrating a semiconductor device according to an example embodiment of the inventive concepts. FIG. 2a is a perspective view illustrating a normal gate in FIG. 1. FIG. 2b is a cross-sectional view according to line A-A of FIG. 1. FIG. 3 is a cross-sectional view according to line B-B of FIG. 1. FIG. 4 is a cross-sectional view according to line C-C of FIG. 1.

Referring to FIGS. 1 through 4, a semiconductor device 1 may include a substrate 10, a plurality of active fins F11, F12, F13, F21, F22, F23, F31, F32, and F33, a plurality of dummy gate electrodes 120 and 140, a first through a third normal gate electrode 110, 130, and 140, a first and a second device isolation region 20 and 22, and a field insulating region 24.

The plurality of active fins F11 through F33 may be formed on the substrate 10. The plurality of active fins F11 through F33 may protrude from the substrate 10 and extend in a first direction (X-direction).

The substrate 10 may be a semiconductor substrate. The substrate 10 may comprise at least one of a semiconductor material, e.g., silicon (Si), germanium (Ge), silicon germanium (SiGe), gallium phosphide (GaP), gallium arsenide (GaAs), silicon carbide (SiC), silicon germanium carbide (SiGeC), indium arsenide (InAs), and/or indium phosphide (InP). However, the substrate 10 may not be restricted or limited thereto. In example embodiments of the present inventive concepts, the substrate 10 may be a silicon-on-insulator (SOI) substrate.

The plurality of active fins F11 through F33 may be spaced apart from each other at a distance. The active fins F11, F21, and F31 may be spaced apart from the active fins F12, F22, and F32 along the first direction (X-direction), respectively. The active fins F12, F22, and F32 may be spaced apart from the active fins F13, F23, and F33 along the first direction (X-direction), respectively. The active fins F12, F12, and F13 may be spaced apart from the active fins F21, F22, and F23 along a second direction (Y-direction). The active fins F21, F22, and F23 may be spaced apart from the active fins F31, F32, and F33 along the second direction (Y-direction).

The active fins F11 through F33 may have long sides and short sides. The long sides of the active fins F11 through F33 may extend in the first direction (X-direction) and the short sides of the active fins F11 through F33 may extend in the second direction (Y-direction). However, the active fins F11 through F33 may not be restricted or limited thereto. For example, in example embodiments, the long sides of the active fins F11 through F33 may extend in the second direction (Y-direction), and the short sides of the active fins F11 through F33 may extend in the first direction (X-direction).

The active fins F11 through F33 may be a part of the substrate 10 or an epitaxial layer formed on the substrate 10. The active fins F11 through F33 may comprise a semiconductor material, e.g., silicon (Si) or silicon germanium (SiGe).

In example embodiments, upper surfaces of the active fins F11 through F33 may have a first upper surface S1 and a second upper surface S2, respectively. The first upper surface S1 may have a higher level than the second upper surface S2. For example, the upper surfaces of the active fins F11 through F33 may have concave shapes.

As shown in FIG. 2b, the first upper surface S1 of the active fins F22 may be adjacent to the first and second isolation regions 20 and 22. The second surface S2 of the active fin 22 may be disposed at a center portion of the active fin F22.

The field insulating region 24 may be adjacent to the long sides of the active fins F11 through F33. The field insulating region 24 may be formed on the substrate 10. The field insulating region 24 may cover some portions of sidewalls of the active fins F11 through F33 and expose the upper surfaces of the active fins F11 through F33. The field insulating region 24 may extend in the first direction (X-direction) along the long sides of the active fins F11 through F33.

In example embodiments, an upper surface of the field insulating region 24 may comprise a seventh upper surface S7 and an eighth upper surface S8. The seventh upper surface S7 may have a higher level than the eighth upper surface S8. The upper surface of the field insulating region 24 may have a concave shapes.

The seventh upper surface S7 of the field insulating region 24 may be adjacent to the short sides of the active fins F11 through F33 and the eighth upper surface S8 of the field insulating region 24 may be disposed at a center portion of the active fins F11 through F33.

In example embodiments, the field insulating region 24 may comprise a silicon oxide layer, a silicon nitride layer, and/or a silicon oxynitride layer. However, it shall not be restricted or limited thereto.

The first device isolation region 20 may be disposed at sidewalls of the active fins F12, F22m and F32 (e.g., a left side of the active Fin 22 as shown in FIG. 2b) and extended in the second direction (Y-direction) along the short sides of the active fins F12, F22, and F32. The first device isolation region 20 may contact with the field insulating region 24 at all angular points where the long sides and the short sides of the active fins F11 through F33 are met.

In example embodiments, a bottom surface of the first device isolation region 20 may have substantially the same height as an upper surface of the substrate 10. The bottom surface of the first device isolation region 20 may have substantially the same height as bottom surfaces of the active fins F11 through F33.

In example embodiments, the upper surface of the first device isolation region 20 may have substantially the same height as upper surfaces of the active fins F11 through F33.

In example embodiments, the upper surface of the first device isolation region 20 may comprise a third upper surface S3 and a fourth upper surface S4. The third upper surface S3 may have a higher level than the fourth upper surface S4. The upper surface of the first device isolation region 20 may have a concave shape.

The third upper surface S3 of the first device isolation region 20 may be adjacent to the short sides of the active fins F11 through F33. The fourth upper surface S4 of the first device isolation region 20 may be disposed at a center portion of the first device isolation region 20. The first device isolation region 20 may extend in the second direction (Y-direction).

In example embodiments, the first device isolation region 20 may comprise a silicon oxide layer, a silicon nitride layer, and/or a silicon oxynitride layer. However, it shall not be restricted or limited thereto.

The second device isolation region 22 may be disposed at sidewalls of the active fins F12, F22, and F32 (e.g., a right side of the active Fin 22 as shown in FIG. 2b) and extended in the second direction (Y-direction) along the short sides of the active fins F12, F22, and F32. The second device isolation region 22 may contact with the field insulating region 24 at all angular points where the long sides and the short sides of the active fins F11 through F33 are met.

In example embodiments, a bottom surface of the second device isolation region 22 may have substantially the same height as an upper surface of the substrate 10. The bottom surface of the second device isolation region 22 may have substantially the same height as bottom surfaces of the active fins F11 through F33.

In example embodiments, the upper surface of the second device isolation region 22 may have substantially the same height as upper surfaces of the active fins F11 through F33.

In example embodiments, the upper surface of the second device isolation region 22 may comprise a fifth upper surface S5 and a sixth upper surface S6. The fifth upper surface S5 may have a higher level than the sixth upper surface S6. The upper surface of the second device isolation region 22 may have a concave shape.

The fifth upper surface S5 of the second device isolation region 22 may be adjacent to the short sides of the active fins F11 through F33. The sixth upper surface S6 of the second device isolation region 22 may be disposed at a center portion of the second device isolation region 22. The second device isolation region 22 may extend in the second direction (Y-direction).

In example embodiments, the second device isolation region 22 may comprise a silicon oxide layer, a silicon nitride layer, and/or a silicon oxynitride layer. However, it shall not be restricted or limited thereto.

The first device isolation regions 20, the second device isolation regions 22, and the field insulating region 24 may electrically isolate the active fins F11 through F33 each other.

The upper surface of the field insulating region 24 may be lower than the upper surfaces of the first and second device isolation region 20 and 22. Specifically, a seventh upper surface S7 of the field insulating region 24 may be lower than not only the fourth upper surface S4 of the first device isolation region 20 but also the sixth upper surface S6 of the second device isolation region 22.

The first normal gate electrode 110 may cross the active fins F11, F21, and F31 and may extend in the second direction (Y-direction). The second normal gate electrodes 130 may cross the active fins F12, F22, and F32 and may extend in the second direction (Y-direction). The third normal gate electrodes 150 may cross the active fins F13, F23, and F33 and may extend in the second direction (Y-direction). The first through third normal gate electrodes 110, 130, and 150 may be disposed at an acute angle or an obtuse angle to the active fins F11 through F33.

The first normal gate electrode 110 may be spaced apart from the second normal gate electrode 130 at a distance in the first direction (X-direction). The second normal gate electrode 130 may be spaced apart from the third normal gate electrode 150 at a distance in the first direction (X-direction).

The first and third normal gate electrodes 110 and 150 may comprise substantially the same material as the second normal gate electrode 130.

The second normal gate electrode 130 may comprise at least two metal gate layers. Specifically, the second normal gate electrode 130 may comprise a first metal gate layer 134 and a second metal gate layer 135.

In example embodiments, the second normal gate electrode 130 may comprise more than two metal gate layers.

The first metal gate layer 134 may control a workfunction of the second normal gate electrode 130. The second metal gate layer 135 may be formed on the first metal gate layer 134. The first metal gate layer may have a concave shape and the second metal gate layer 135 may fill a space formed on an upper surface of the first metal gate layer 134.

The first metal gate layer 134, as shown in FIG. 2b, may be formed on a gate dielectric layer 133 and extends upward along a sidewall of the second metal gate layer 135.

The first metal gate layer 134, as shown in FIG. 4, may extend in the second direction (Y-direction) along the upper surface of the field insulating layer 24 and the sidewall of the active fin 22.

The first metal gate layer 134 may include one or more of titanium nitride, tantalum nitride, titanium carbide, titanium aluminum carbide or tantalum carbide. The second metal gate layer 135 may include tungsten or aluminum. However, it shall not be restricted or limited thereto.

The second normal gate electrode 130 may be formed by using a gate replacement process.

In example embodiments, the second normal gate electrode 130 may include silicon or silicon germanium. The second normal gate electrode 130, as shown in FIGS. 2b and 3, may be formed on the second upper surface S2 of the active fin 22 and on an eighth upper surface S8 of the field insulating region 24. The first upper surface S1 of the active fin F22 may have a concave shape. Therefore, an upper surface of a center portion of the active fin F22 may be lower than an upper surface of an edge portion of the active fin F22 which is adjacent to the first or second device isolation region 20 or 22. Furthermore, an upper surface of the field insulating region 24 which is disposed below the second normal gate electrode 130 may be lower than an upper surface of the of the field insulating region 24 which is adjacent to the first or second device isolation region 20 or 22.

The gate dielectric layer 133 may be formed below the second normal gate electrode 130. The gate dielectric layer 133 may include a high-k material having a dielectric constant higher than a silicon dioxide layer, e.g., hafnium dioxide, zirconium dioxide, lanthanum oxide, aluminum oxide, or tantalum oxide.

The gate dielectric layer 133, as shown in FIG. 2b, may be formed on the active fin F22 and extend upward along a sidewall of the second normal gate electrode 130.

The gate dielectric layer 133, as shown in FIG. 4, may extend in the second direction (Y-direction) along the upper surfaces of the field insulating region 24 and a sidewall of the active fin F22.

A normal spacer 131 may be formed a sidewall of the second normal gate electrode 130. In example embodiments, the normal spacer 131 may be formed both sides of the second normal gate electrode 130.

The normal spacer 131 may include nitride. Specifically, the normal spacer 131 may include a silicon nitride layer. However, it shall not be restricted or limited thereto. In example embodiments, the normal spacer 131 may include silicon oxide and/or silicon oxynitride.

A filler pattern 132 may be disposed between the normal spacer 131 and the gate dielectric layer 133. The filler pattern, as shown FIGS. 2b and 3, may extend upward from the upper surface of the active fin F22 along the sidewall of the normal spacer 131.

In example embodiments, the filler pattern 132 may have an etch selectivity to the normal spacer 131. The filler pattern 132 may include silicon oxynitride.

In example embodiments, the filler pattern 132 may comprise two layers which include a lower pattern and an upper pattern. The lower pattern may have a material different from a material of the upper pattern. In example embodiments, the filler pattern 132 may include more than two layers.

The first and second dummy gate electrodes 120 and 140 may extended in the second direction (Y-direction) along the upper surfaces of the first and second device isolation regions 20 and 22.

Specifically, the first dummy gate electrode 120 may be formed on the first device isolation region 20 and the second dummy gate electrode 140 may be formed on the second device isolation region 22.

In example embodiments, the active fin F22 may not overlap with the first dummy gate electrode 120 and the second dummy gate electrode 140. However, the overlap between the active fin F22 and the first dummy gate electrode 120 may not be restricted or limited thereto, Therefore, in example embodiments, the active fin F22 may overlap with the first dummy gate electrode 120 or the second dummy gate electrode 140.

The first and second dummy gate electrodes 120 and 140 may extend in the second direction (Y-direction), However the direction of the first and second dummy gate electrodes 120 and 140 may not be restricted or limited thereto. Therefore, in example embodiments, the first and second dummy gate electrodes 120 and 140 may be disposed at an acute angle or an obtuse angle to the second direction (Y-direction).

The first dummy gate electrodes 120 may include a first mask layer pattern 124 including a silicon nitride layer and a first polysilicon gate electrode 123 including a first polysilicon layer. The second dummy gate electrodes 140 may include a second mask layer pattern 144 including a silicon nitride layer and a second polysilicon gate electrode 143 including a first polysilicon layer.

The first dummy gate electrode 120 may be formed on the fourth upper surface S4 of the first device isolation region 20. The fourth upper surface S4 of the first device isolation region 20 may be lower than the third upper surface S3 of the first device isolation region 20 which is adjacent to the active fin F22.

The second dummy gate electrode 140 may be formed on the sixth upper surface S6 of the second device isolation region 22. The sixth upper surface S6 of the second device isolation region 22 may be lower than the fifth upper surface S5 of the second device isolation region 22 which is adjacent to the active fin F22.

The first and second dummy gate electrodes 120 and 140 may have undercut portions UC disposed at a lower portion of the first and second polysilicon gate electrodes 123 and 143, respectively.

The first and second fillers 122 and 142 may fill the undercut portions UC of the first and second dummy gate electrodes 120 and 140. The first and second fillers 122 and 142 may extend upward from the upper surfaces of the first and second isolation regions 20 and 22 along the sidewalls of the first and second dummy spacers 121 and 141. The first and second fillers 122 and 142 may cover the sidewalls of first and second polysilicon gate electrodes 123 and 143.

The first and second fillers 122 and 142 may include a material having an etch selectivity to the first and second dummy spacers 121 and 141. The first and second fillers 122 and 142 may include silicon nitride.

The first and second fillers 122 and 142 may be a bilayer structure having a first filler and a second filler disposed on the first filler. The first filler may have a different material from the second filler.

In example embodiments, the first and second filler 122 and 142 may be a multiple structure having more than two layers.

The first and second dummy spacers 121 and 141 may be formed on the sidewalls of the first and second dummy gate electrodes 120 and 140. Specifically, the first dummy spacer 121 may be formed on the both sidewalls of the first dummy gate electrode 120 and the second dummy spacer 141 may be formed on the both sidewalls of the second dummy gate electrode 140. The first and second dummy spacers 121 and 141 may have substantially the same material as the normal spacer 131.

A doped epitaxial layer 42 may be formed on a portion of the active fin F22 disposed at both sides of the normal gate electrode 130. The doped epitaxial layer 42 may be formed at a recess region of the active fin F22. The doped epitaxial layer 42 may be formed by using an epitaxial growth process.

In example embodiments, the doped epitaxial layer 42 may be an elevated source/drain region. Therefore, an upper surface of the doped epitaxial layer 42 may be higher than the upper surface of the active fin F22. The doped epitaxial layer 42 may have a semiconductor material, for example silicon, however it shall not be restricted or limited thereto.

If the semiconductor device 1 includes a PMOS transistor, the doped epitaxial layer 42 may include a material having a compressive stress, e.g., silicon germanium having a lattice constant greater than that of silicon. The material having a compressive stress may induce a compressive stress into the source/drain region and increase the carrier mobility in the channel region, which is disposed in the active fin F22, of the PMOS transistor.

According to an example embodiment, if the semiconductor device 1 includes a NMOS transistor, the doped epitaxial layer 42 may include a material having a tensile stress, e.g., silicon carbide or silicon phosphide having a lattice constant less than the lattice constant of silicon. The material having a tensile stress may induce a tensile stress into the source/drain region disposed in the active fin F22 and increase carrier mobility in the channel region, which is disposed in the active fin F22, of the NMOS transistor.

An interlayer dielectric layer 77 may be formed on the dummy gate electrodes 120 and 140 and on the normal gate electrodes 110, 130, and 150. The interlayer dielectric layer 77 may cover upper surfaces of the first dummy gate electrode 120, the second dummy gate electrode 140, and the normal gate electrodes 110, 130, and 150.

According to an example embodiment, if the upper surfaces of the first and second device isolation region 20 and 22, the upper surfaces of the field insulating region 24, and the active fin F22 are not even, at least one of undercut portions UC may be formed at a lower portion of the first and second polysilicon gates 123 and 143. The undercut portions UC may have the gate lengths of the first and second polysilicon gates 123 and 143 be shorter. Thereby, some performance and reliability of the semiconductor device 1 may be degraded.

In example embodiments, the first and second filler 122 and 142 may be formed in the undercut portions UC. The first and second filler 122 and 142 may fill the undercut portions UC and may prevent the gate lengths of the first and second polysilicon gates 123 and 143 from being shorten.

Hereinafter, a semiconductor device 2 according to another example embodiment will be described with reference to FIG. 5.

Figure 5:
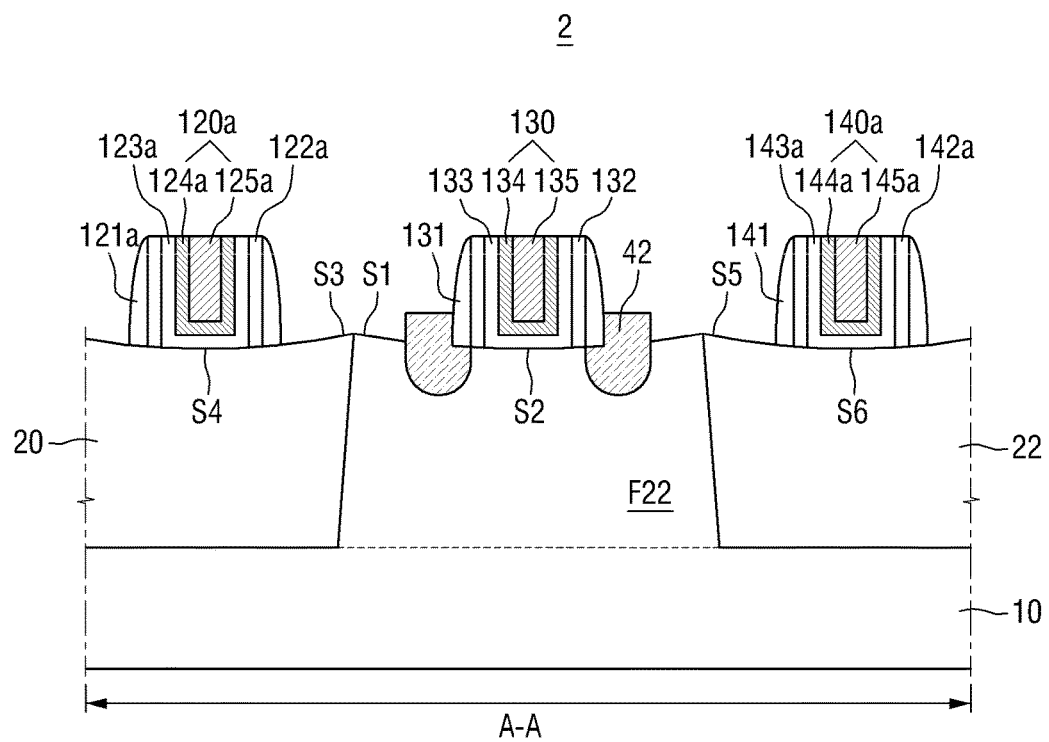
FIG. 5 is a cross-sectional view illustrating a semiconductor device according to an example embodiment of the inventive concepts.

FIG. 5 is a cross-sectional view illustrating a semiconductor device according to an example embodiment of the inventive concepts.

For convenience of explanation, some of descriptions which are substantially the same as descriptions referring to FIGS. 1 through 4 will be omitted.

Referring to FIG. 5, the semiconductor device 2 may include a dummy gate which has a different structure form the first and second dummy gate electrodes 120*a* and 140*a* of the semiconductor device 1 as disclosed above. Specifically, the first and second dummy gate electrodes 120*a* and 140*a* of the semiconductor device 2 may include at least one metal gate electrode.

The first and second dummy gate electrodes 120*a* and 140*a* may include a first metal gate electrode 124*a* (or 144*a*) and a second metal gate electrode 125*a* (or 145*a*). The first metal gate electrode 124*a* (or 144*a*) and a second metal gate electrode 125*a* (or 145*a*) may include substantially the same structure as the first and second metal gate electrodes 134 and 135 of the semiconductor device 1 as described above referring to FIG. 2*b*.

A first and a second gate dielectric layer 123*a* and 143*a* of the semiconductor device 2 may be formed on a first and a second device isolation region 20 and 22, respectively. The first and second gate dielectric layer 123*a* and 143*a* may have substantially the same structure as the gate dielectric layer 133 of the semiconductor device 1. A first and a second filler pattern 122*a* and 142*a* of the semiconductor device 2 may have substantially the same structure as the filler pattern 132 of the semiconductor device 1.

In example embodiments, the first and second dummy gate electrodes 120*a* and 140*a* of the semiconductor device 2 may not have any undercut portions which are different from the first and second dummy gate electrode 120 and 140 of the semiconductor device 1.

Hereinafter, a semiconductor device 3 according to an example embodiment may be described with reference to FIG. 6.

Figure 6:
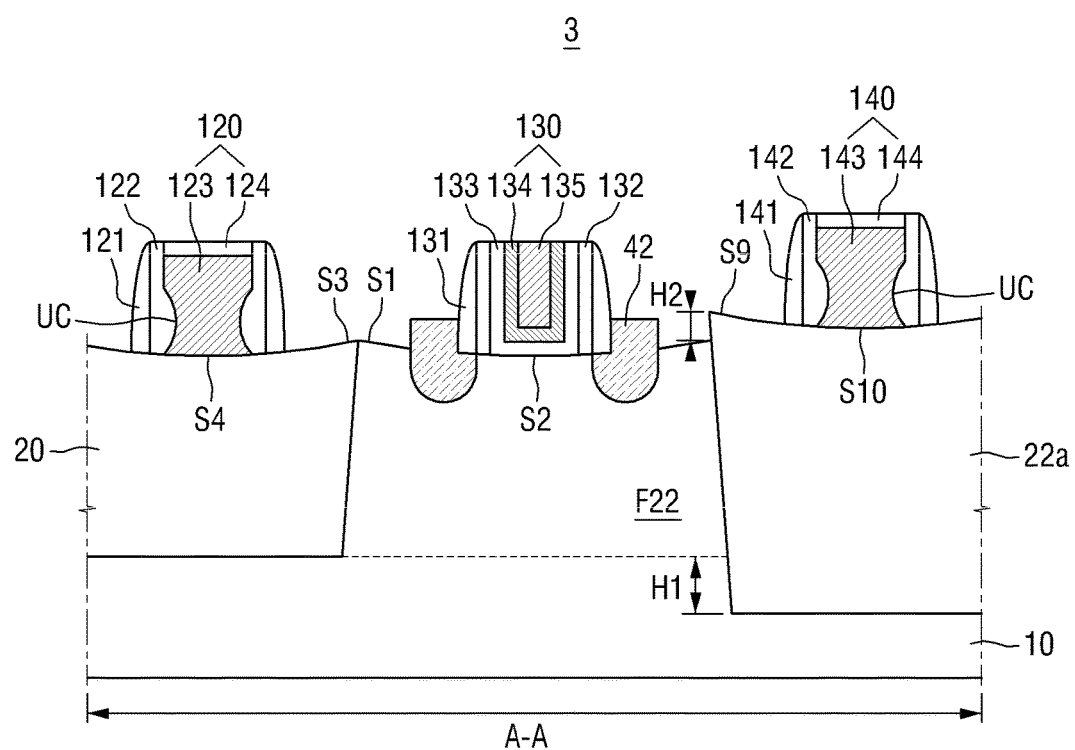
FIG. 6 is a cross-sectional view illustrating a semiconductor device according to an example embodiment of the inventive concepts.

FIG. 6 is a cross-sectional view illustrating a semiconductor device according to an example embodiment of the inventive concepts.

For convenience of explanation, some of descriptions which are substantially the same as descriptions referring to FIGS. 1 through 5 will be omitted.

Referring to FIG. 6, the semiconductor device 3 may include a second device isolation region 22*a* which has different structure from the second device isolation region 22 of the semiconductor device 1.

A bottom surface of the second device isolation region 22*a* may be lower than the bottom surface of a first device isolation region 20 of the semiconductor device 3. Specifically, the bottom surface of the second device isolation region 22*a* may be as low as H1 than the bottom surface of the first device isolation region 20.

In example embodiments, the bottom surface of the second device isolation region 22*a* may be lower than the upper surface of the substrate 10, i.e., lower than the bottom surface of the active fin F22.

In example embodiments, an upper surface of the second device isolation region 22*a* may be higher than the upper surface of the first device isolation region 20. Specifically, the upper surface of the second device isolation region 22*a* may be as high as H2 than the upper surface of the first device isolation region 20.

Therefore, the total height of the second device isolation region 22*a* may be high as H1 plus H2 than the total height of the first device isolation region 20.

The upper surface of the second device isolation region 22*a* may be higher than the upper surface of the active fin F22.

Hereinafter, a semiconductor device 4 according to an example embodiment may be described with reference to FIGS. 7 and 8.

Figure 7:
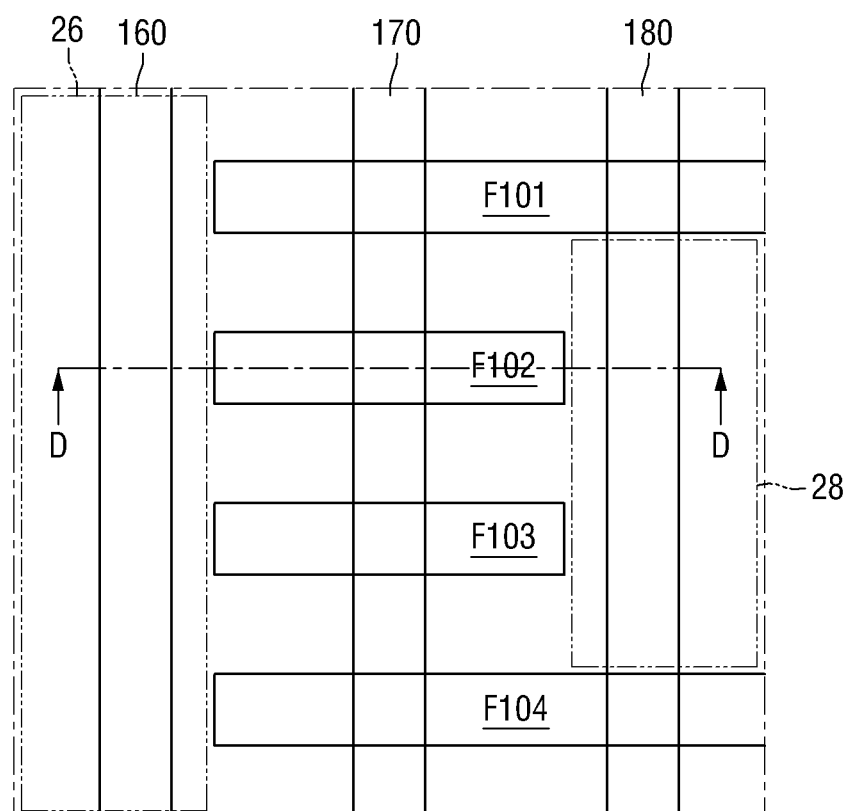
FIG. 7 is a layout illustrating a semiconductor device according to an example embodiment of the inventive concepts.

FIG. 7 is a layout illustrating a semiconductor device 4 according to an example embodiment of the inventive concepts. FIG. 8 is a cross-sectional view according to line D-D of FIG. 7.

Figure 8:
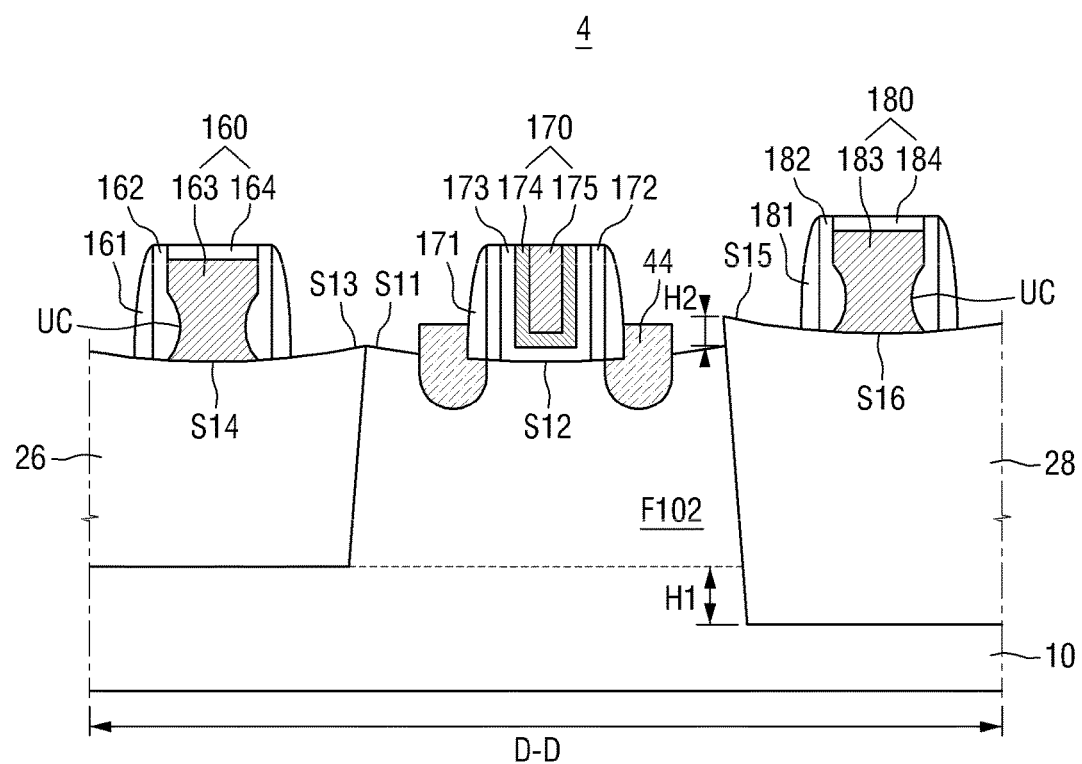
FIG. 8 is a cross-sectional view according to line D-D of FIG. 7.

Referring to FIGS. 7 and 8, the semiconductor device 4 may include a first and a second device isolation region 26 and 28 and a plurality of active fins F101, F102, F103, and F104. The second device isolation region 28 may be adjacent to sidewalls of the active fins F102 and F103. The second device isolation region 28 may not pass through the active fins F101 and F104.

The second isolation region 28 may be adjacent to long sides of the active fins F101 and F104. The second isolation region 28 may be adjacent to short sides of the active fins F102 and F103.

The long side lengths of the active fins F101 and F104 may be greater than the long side lengths of the active fins F102 and F103. For example, the active fins F101 and F104 may be more extended than the active fins F102 and F103 in the first direction (X-direction).

A first dummy gate electrode 160 of the semiconductor device 4 may be disposed on the first device isolation region 26 and extended in the second direction (Y-direction). An upper surface of the first device isolation region 26 may include a thirteenth upper surface S13 and a fourteenth upper surface S14 having a lower level than the thirteenth upper surface S13. The first dummy gate electrode 160 may be disposed on the fourteenth upper surface S14.

A second dummy gate electrode 180 may be disposed on the second device isolation region 28 and extended in the second direction (Y-direction). The active fins F102 and F103 may overlap with the second dummy gate electrode 180. However, the active fins F101 and F104 may be not overlapped by the second dummy gate electrode 180. The upper surface of the second device isolation region 28 may include a fifteenth upper surface S15 and a sixteenth upper surface S16 having a lower level than the fifteenth upper surface S15. The second dummy gate electrode 180 may be disposed on the sixteenth upper surface S16.

A normal gate electrode 170 may cross the active fins F101, F102, F103, and F104. The normal gate electrode 170 may extend in the second direction (Y-direction). The upper surfaces of the active fins F101 through F104 may include a eleventh upper surface S11 and a twelfth upper surface S12 having a lower level than the eleventh upper surface S11. The normal gate electrode 170 may be disposed on the twelfth upper surface S12.

The normal gate electrode 170 may be substantially the same as the normal gate electrode 130.

The first and second dummy gate electrodes 160 and 180 may be substantially the same as the first and second dummy gate electrodes 120 and 140 of the semiconductor device 1 referring to FIG. 2b. A first and a second filler 162 and 182 may be substantially the same as the first and the second filler 122 and 142, respectively. A first and a second dummy spacer 161 and 181 may be substantially the same as the first and the second dummy spacer 121 and 141, respectively.

A gate dielectric layer 173, a filler pattern 172, and a normal spacer 171 may be substantially the same as the gate dielectric layer 133, a filler pattern 132, and a normal spacer 131, respectively.

Hereinafter, a semiconductor device 5 according an example embodiment may be described with reference to FIG. 9a.

Figure 9A:
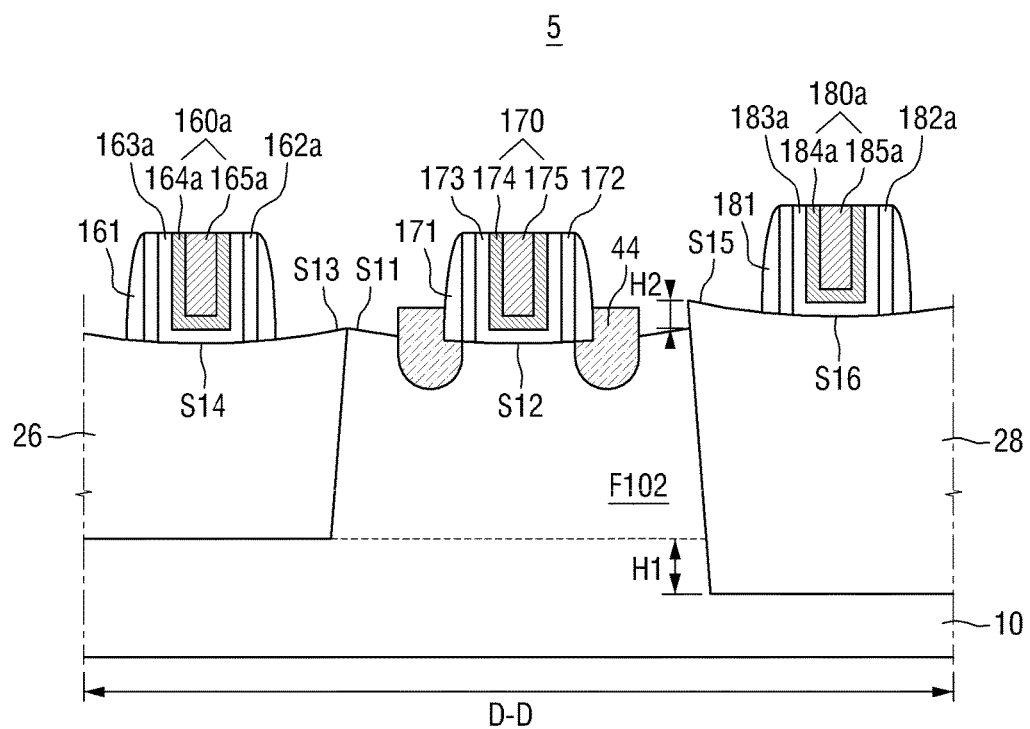
FIG. 9a is a cross-sectional view illustrating a semiconductor device according to an example embodiment of the inventive concepts.

FIG. 9a is a cross-sectional view illustrating a semiconductor device according to an example embodiment of the inventive concepts.

For convenience of explanation, some of descriptions which are substantially the same as descriptions referring to FIGS. 1 through 8 will be omitted.

Referring to FIG. 9a, the semiconductor device 5 may include a first and a second dummy gate electrode 160a and 180a which are different from the first and second dummy gate electrodes 160 and 180 of the semiconductor device 4. Specifically, the first and second dummy gate electrodes 160a and 180a may include at least one metal gate electrode.

The first and second dummy gate electrodes 160a and 180a may include a first metal gate electrode 164a (or 184a) and a second metal gate electrode 165a (or 185a). The first metal gate electrode 164a (or 184a) and a second metal gate electrode 165a (or 185a) may include substantially the same structure as the first and second metal gate electrodes 134 and 135 of the semiconductor device 1 as described above referring to FIG. 2b.

A first and a second gate dielectric layer 163a and 183a of the semiconductor device 5 may have substantially the same structure as the gate dielectric layer 133 of the semiconductor device 1. A first and a second filler pattern 162a and 182a of the semiconductor device 5 may have substantially the same structure as the filler pattern 132 of the semiconductor device 1.

In example embodiments, the first and second dummy gate electrodes 160a and 180a of the semiconductor device 5 may not have any undercut portions which are different from the first and second dummy gate electrode 120 and 140 of the semiconductor device 1.

Hereinafter, a semiconductor device 6 according to an example embodiment may be described with reference to FIG. 9b.

Figure 9B:
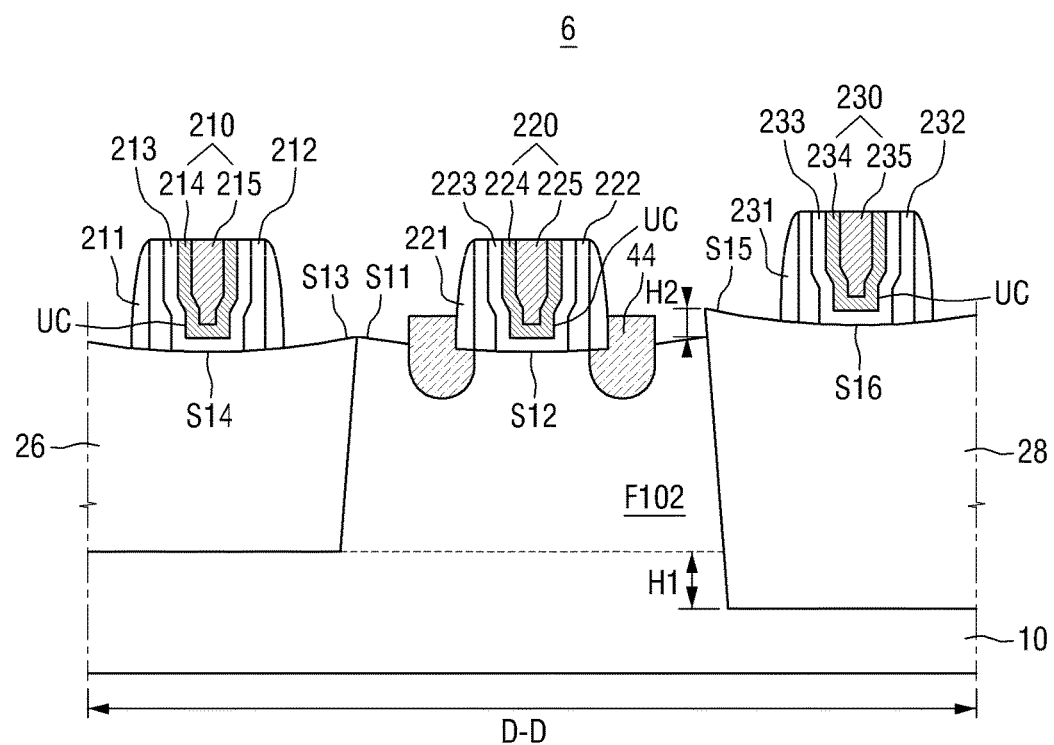
FIG. 9b is a cross-sectional view illustrating a semiconductor device according to an example embodiment of the inventive concepts.

FIG. 9b is a cross-sectional view illustrating a semiconductor device according to an example embodiment of the inventive concepts.

For convenience of explanation, some of descriptions which are substantially the same as descriptions referring to FIGS. 1 through 9a will be omitted.

Referring to FIG. 9b, the semiconductor device 6 may include a first dummy gate electrode 210, a second dummy gate electrode 230, a normal gate electrode 220. The first dummy gate electrode 210, the second dummy gate electrode 230, and the normal gate electrode 220 may include at least one metal gate electrode and may include at least one undercut portion UC.

The undercut portions UC of the first dummy gate electrode 210, the second dummy gate electrode 230, and the normal gate electrode 220 may be formed at each lower portion of the first dummy gate electrode 210, the second dummy gate electrode 230, and the normal gate electrode 220.

The first and second dummy gate electrodes 180 and 230 may include a first metal gate electrode 214 (or 234) and a second metal gate electrode 215 (or 235). The first metal gate electrode 214 (or 234) and a second metal gate electrode 215 (or 235) may include substantially the same structure as the first and second metal gate electrodes 134 and 135 of the semiconductor device 1 as described above referring to FIG. 2b.

Hereinafter, a semiconductor device 7 according to an example embodiment may be described with reference to FIG. 9c.

Figure 9C:
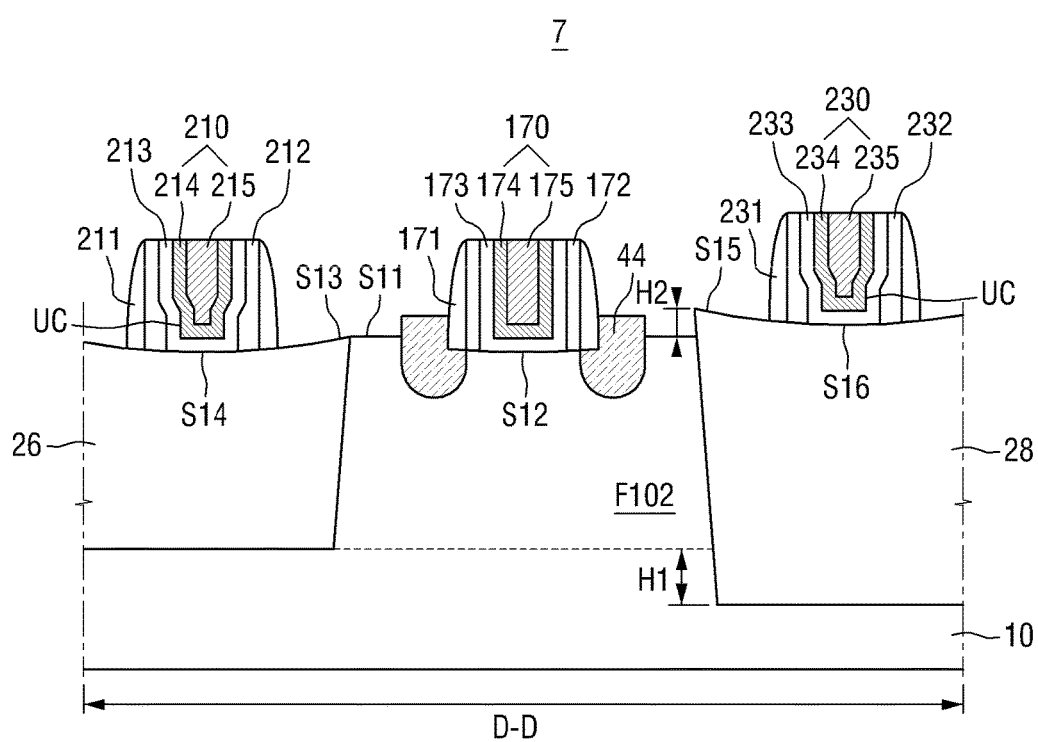
FIG. 9c is a cross-sectional view illustrating a semiconductor device according to an example embodiment of the inventive concepts.

FIG. 9c is a cross-sectional view illustrating a semiconductor device according to an example embodiment of the inventive concepts.

For convenience of explanation, some of descriptions which are substantially the same as descriptions referring to FIGS. 1 through 9b will be omitted.

Referring to FIG. 9c, the semiconductor device 7 may include a first and a second dummy gate electrode 210 and 230, and include a normal gate electrode 170. The first and second dummy gate electrodes 210 and 230 may include substantially the same structure as the first and second dummy gate electrodes of the semiconductor device 6 as described above referring to FIG. 9b. However, the normal gate electrode 170 may have a different structure from the normal gate electrode 220 of the semiconductor device 6.

Upper surfaces of the active fins F101, F102, F103, and F104 of the semiconductor device 7 may have a eleventh upper surface S11 and a twelfth upper surface S12 having substantially the same height as the eleventh upper surface S11. Specifically, the upper surfaces of the active fins F101, F102, F103, and F104 may have flat surface. Therefore, the normal gate electrode 170 may not have any undercut portions UC.

The first dummy gate electrode 210, the second dummy gate electrode 230, and the normal gate electrode 170 may include at least one metal gate electrode. The first and second dummy gate electrodes 210 and 230 may have undercut portions UC.

Hereinafter, a semiconductor device 8 according to an example embodiment may be described with reference to FIGS. 9d and 9e.

Figure 9D:
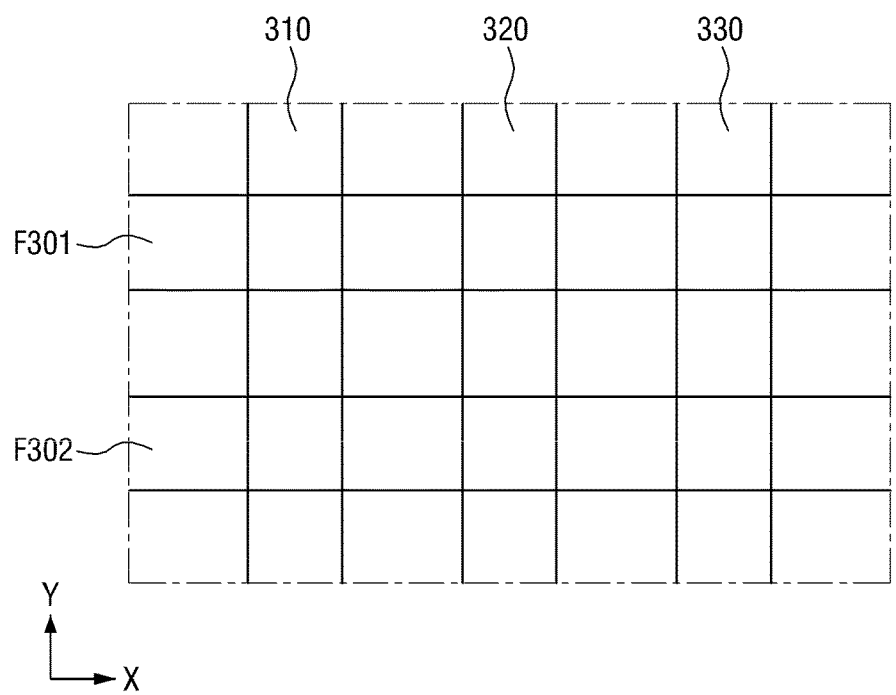
FIG. 9d is a cross-sectional view illustrating a semiconductor device according to an example embodiment of the inventive concepts.

FIG. 9d is a cross-sectional view illustrating a semiconductor device according to an example embodiment of the inventive concepts. FIG. 9e is a perspective view illustrating a semiconductor device shown in FIG. 9d.

For convenience of explanation, some of descriptions which are substantially the same as descriptions referring to FIGS. 1 through 9c will be omitted.

Figure 9E:
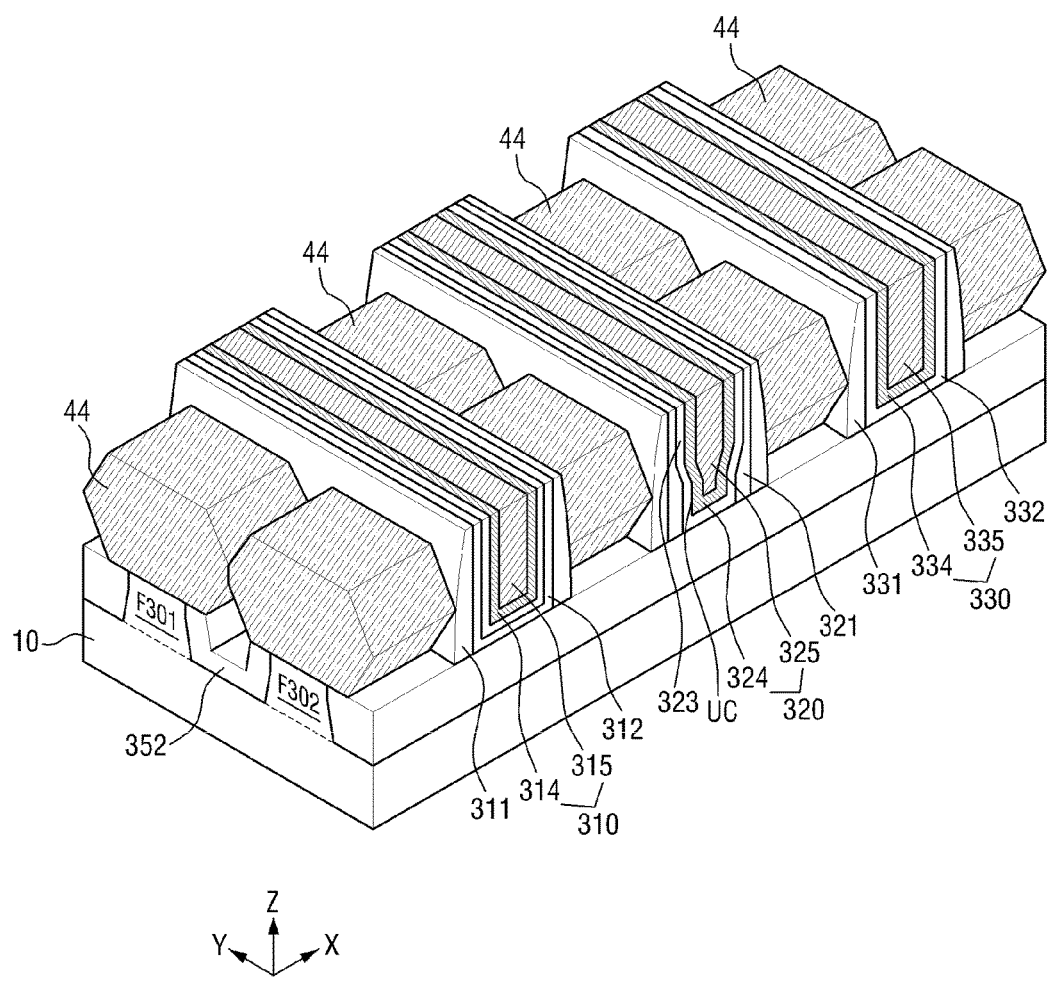
FIG. 9e is a perspective view illustrating a semiconductor device shown in FIG. 9d.

Referring to FIGS. 9d and 9e, active fins F301 and F302 may be formed by protruding from the substrate 10 and extended in the first direction (X-direction). Specifically, the active fins F301 and F302 may extend in the first direction (X-direction) and spaced from each other at a distance in the second direction (Y-direction).

A field insulating region 352 may be disposed between the active fins F301 and F302. An upper surface of the field insulating region 352 may include a first region and a second region. The first region of the upper surface of the field insulating region 352 may be adjacent to the active fins F301 and F302. The second region of the upper surface of the field insulating region 352 may be lower than the first region and be disposed far from the active fins F301 and F302. Specifically, the upper surface of the field insulating region 352 may have a concave shape.

A first normal gate electrode 310, a second normal gate electrode 320, and a third normal gate electrode 330 may extend in the second direction (Y-direction) on the active fins F301 and F302. The first through third normal gate electrodes 310, 320, and 330 may cross the active fins F301 and F302. The first through third normal gate electrodes 310, 320, and 330 may be spaced from each other at a distance in the first direction (X-direction).

The first through third normal gate electrodes 310, 320, and 330 may include at least one metal gate electrode. The second normal gate electrode 320 may have an undercut portion UC at a lower portion thereof. However, the first and third normal gate electrodes 310 and 330 may not have any undercut portions UC.

Figure 10A:
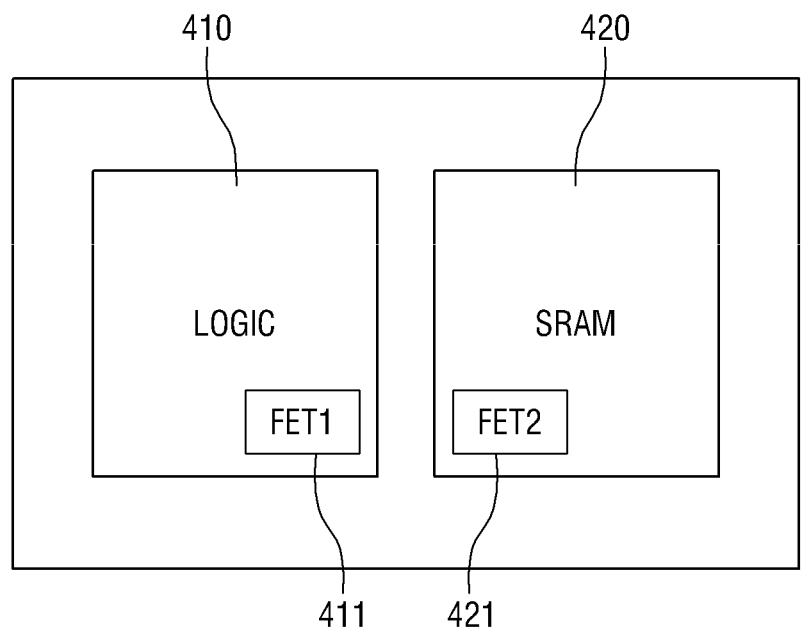
FIGS. 10a and 10b are block diagrams of memory systems including a semiconductor device according to an example embodiment of the inventive concepts.
Figure 10B:
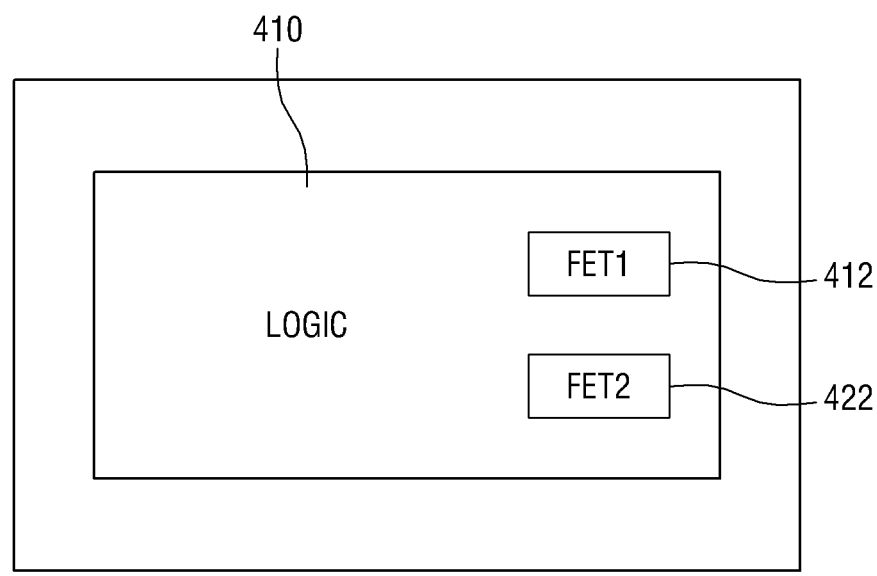

FIGS. 10a and 10b are block diagrams of memory systems including a semiconductor device according to an example embodiment of the inventive concepts.

Referring to FIG. 10a, a semiconductor device 13 may include a logic region 410 and a SRAM region 420. A first transistor 411 may be formed in the logic region 410 and a second transistor 421 may be formed in the SRAM region.

In example embodiments, the first transistor 411 may have a different structure from the second transistor 421. For example, the first transistor 411 may have an undercut portion, but the second transistor 421 may not have any undercut portion.

Referring to FIG. 10b, a semiconductor device 14 may include a logic region 410. A third and a fourth transistor 412 and 422 may be formed in the logic region 410. The third transistor 412 may have a different structure from the fourth transistor 422.

In example embodiments, the third transistor 412 may be a NMOS transistor and the fourth transistor 422 may be a PMOS transistor. However, it shall not be restricted or limited thereto. The third transistor 412 or the fourth transistor 422 may include one of semiconductor devices according to present inventive concepts.

The SRAM region, shown in FIG. 10a, may be replaced to a DRAM region, a MRAM region, a RRAM region, or a PRAM region.

Figure 11:
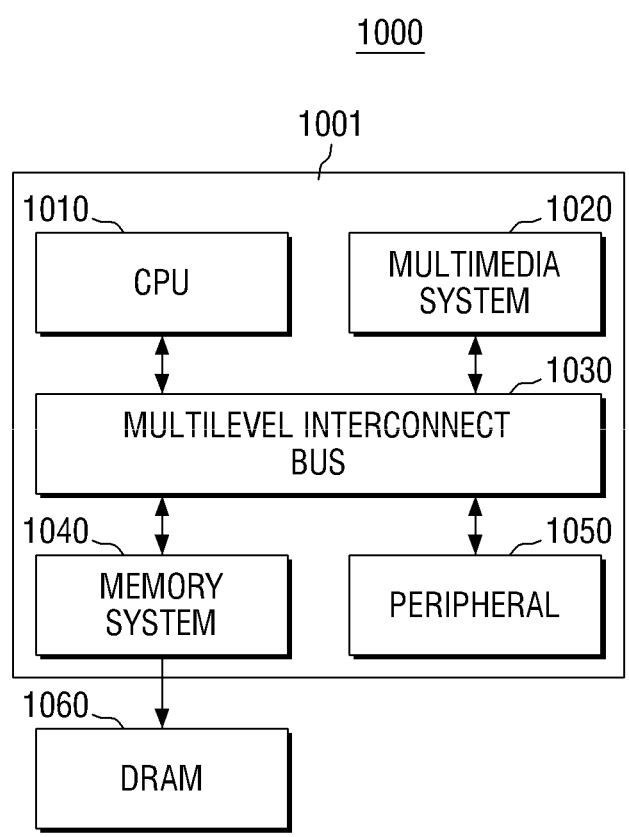
FIG. 11 is a block diagram of a SoC (System on Chip) including a semiconductor device according to an example embodiment of the inventive concepts.

FIG. 11 is a block diagram of a SoC (System on Chip) including a semiconductor device according to an example embodiment of the inventive concepts.

Referring to FIG. 11, the SoC 1000 may comprise an application processor 1001 and a DRAM device 1060. The application processor 1101 may include a central processing unit 1010, a multimedia system 1020, a bus 1030, a memory system 1040, and a peripheral circuit 1050.

The central processing unit 1010 may perform operations required for driving the SoC 1000. The multimedia system 1020 may include a three-dimensional engine module, a video codec, a display system, a camera system, or a post-processor. The central processing unit 1010, the multimedia system 1020, the memory system 1040, and the peripheral circuit 1050 may communicate with each other through the bus 1030. The bus 1030 may have a multi-layer structure, for example, a multi-layer advanced high-performance bus (AHB) or a multi-layer advanced extensible interface (AXI).

Figure 15:
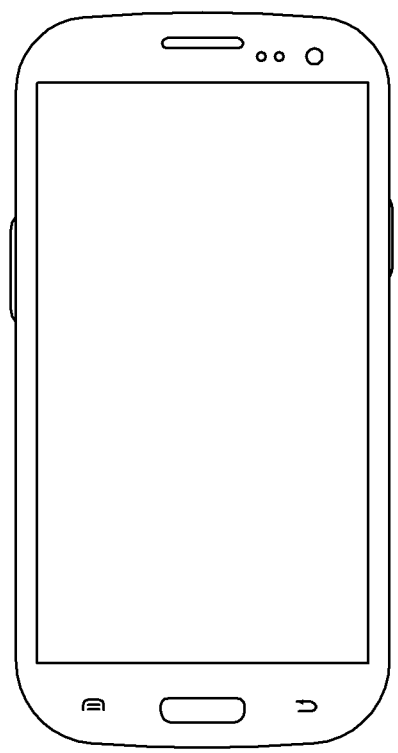

The memory system 1040 may provide a required environment for performing a high-speed operation while the application processor 1001 is connected with an external device. The external device may be a DRAM device. The peripheral circuit 1050 may provide a required environment for which the SoC 1000 is able to smoothly connect with an external device. In this case the external device may be a main board. The DRAM device 1060 may be disposed outside the application processor 1001 as shown in FIG. 15. The DRAM device 1060 may be packaged with the application processor 1001 in order to make a package type of a PoP (Package on Package).

At least one element of the SoC 1000 may include a semiconductor device according to an example embodiment of the inventive concepts mentioned above.

Figure 12:
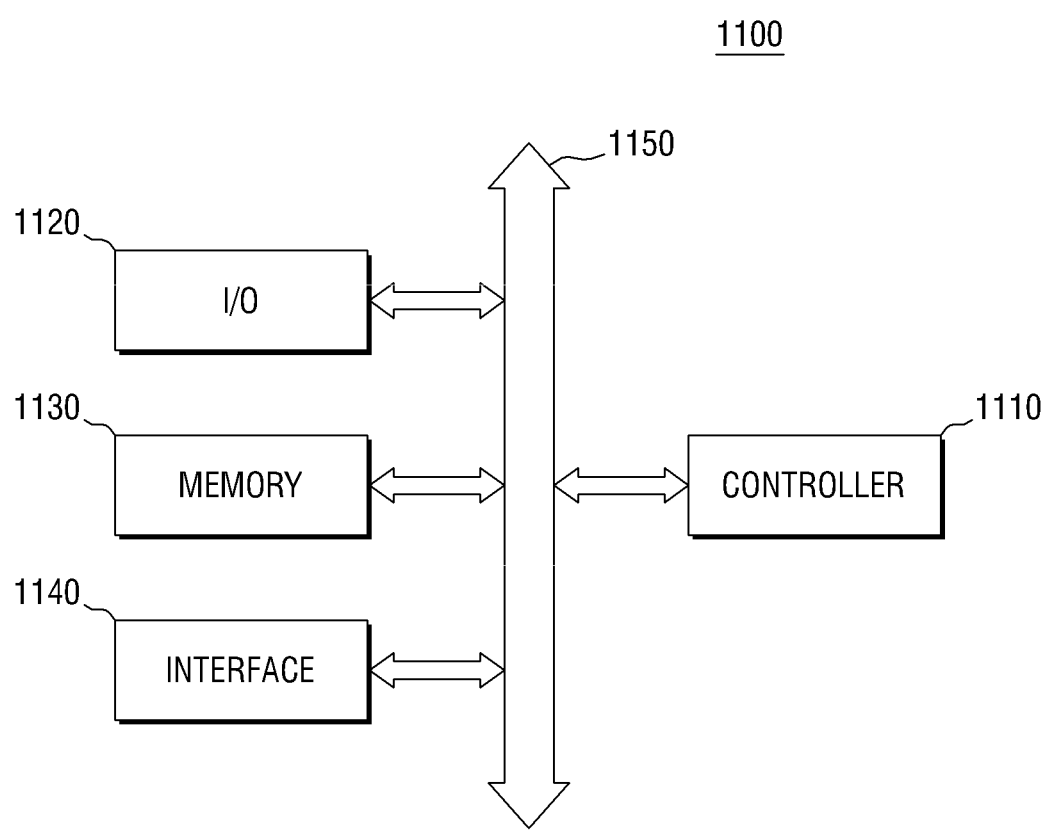
FIG. 12 is a system block including an electronic system according to an example embodiment of the inventive concepts.

FIG. 12 is a system block including an electronic system according to an example embodiment of the inventive concepts.

Referring to FIG. 12, the electronic system 1100 may comprise a controller 1110, an input/output device 1120, a memory device 1130, an interface 1140, and a bus 1150. The controller 1110, the input/output device 1120, the memory device 1130, and the interface 1140 may communicate with each other through the bus 1150. The bus 1150 may correspond to a path that data can be moved to each other.

The controller 1110 may comprise a microprocessor, a digital signal processor, a microcontroller, or a similar device that can control an executive program. The input/output device 1120 may comprise a keypad, a keyboard, or a display. The memory device 1130 may not only save codes or data for executing the controller 1110 but also save data executed by the controller 1110. The memory device 1130 may comprise a semiconductor device according to an example embodiment of the inventive concepts.

The memory system 1100 may be applied to a product that can transport information, e.g., a personal digital assistant (PDA), a portable computer, a web tablet, a wireless phone, a mobile phone, a digital music player, or a memory card.

Figure 13:
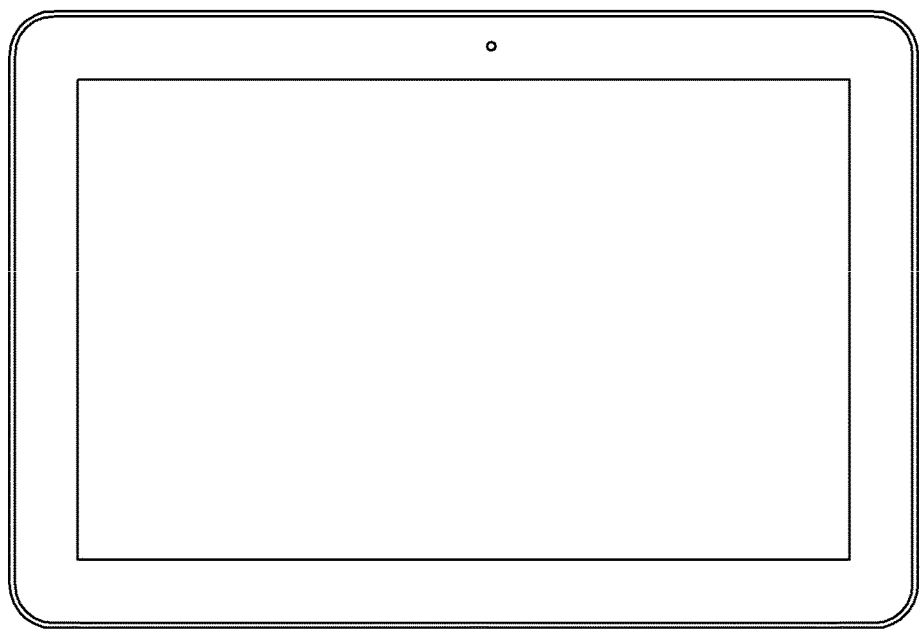
FIGS. 13-15 are electronic devices including a semiconductor device according to an example embodiment of the inventive concepts.

FIGS. 13 and 15 are electronic devices including a semiconductor device according to an example embodiment of the inventive concepts.

Figure 14:
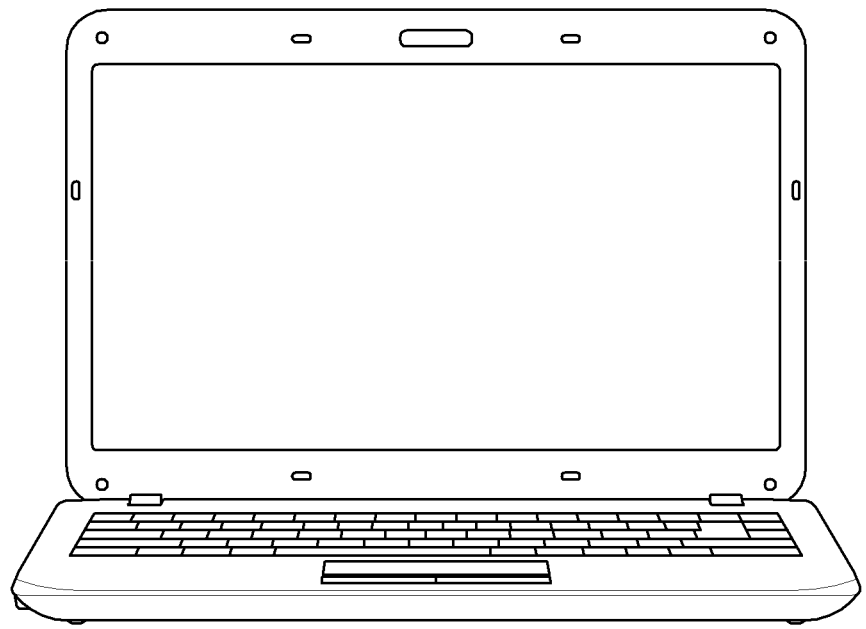

FIG. 13 is a view illustrating a tablet personal computer 1200, FIG. 14 is a view illustrating a notebook computer 1300, and FIG. 15 is a view illustrating a smart phone 1400. A semiconductor device according to at least one example embodiment of the inventive concepts may be applied to the tablet personal computer 1200, the notebook computer 1300, or the smart phone 1400.

In example embodiments, the semiconductor device may be applied to a computer, UMPC (Ultra Mobile PC), an workstation, a net-book, a PDA (Personal Digital Assistants), a portable computer, an wireless phone, a mobile phone, an e-book, a portable multimedia player, a portable game player, a navigation system, a black box, a digital camera, a three-dimensional television, a digital audio recorder, a digital audio player, a digital picture recorder, a digital picture player, a digital video recorder, or a digital video player.

Figure 16:
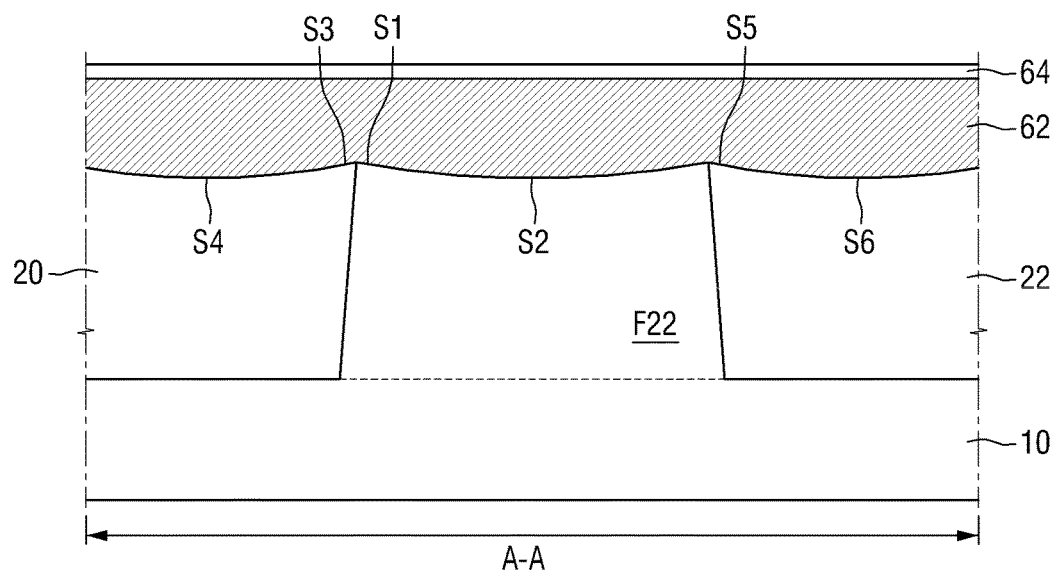
FIGS. 16-20 are cross-sectional views illustrating a method of manufacturing a semiconductor device according to an example embodiment of the inventive concepts.
Figure 20:
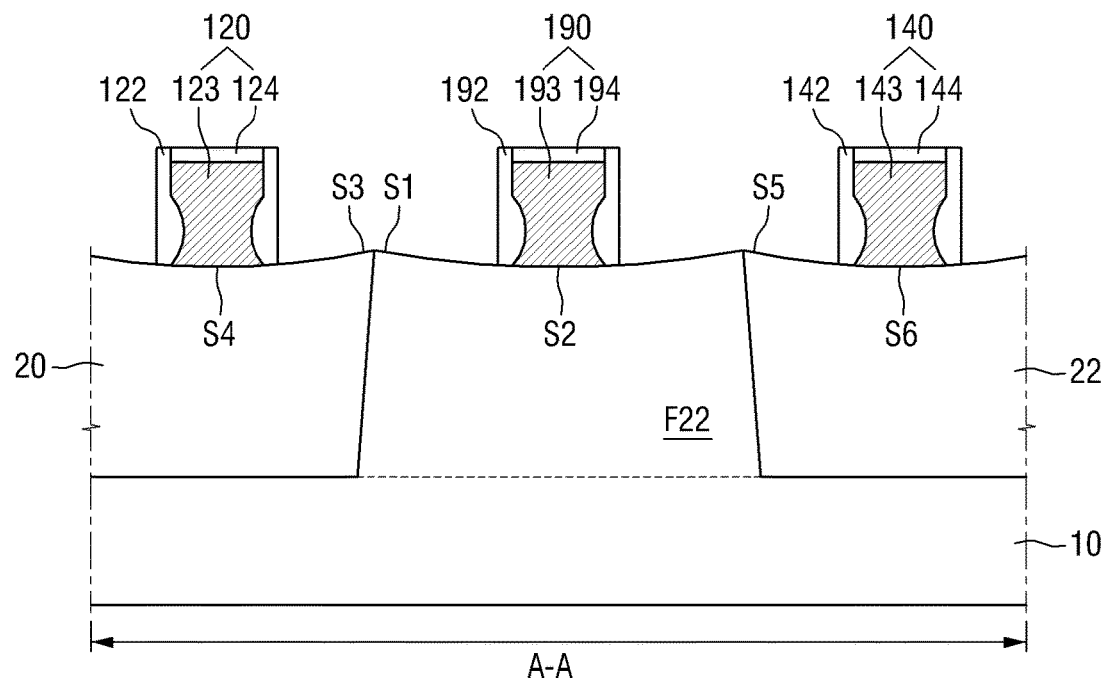

FIGS. 16 and 20 are cross-sectional views illustrating a method of manufacturing a semiconductor device according to an example embodiment of the inventive concepts.

Referring to FIG. 16, an active fin F22 may be formed on the substrate 10. The active fin F22 may be protruded from the substrate 10 and extended in the first direction (X-direction).

In example embodiments, the active fin F22 may be formed by partially etching the substrate 10.

In example embodiments, the active fin F22 may be formed by growing an epitaxial layer on the substrate 10 and patterning the epitaxial layer.

An upper surface of the active fin F22 may include a first upper surface S1 and a second upper surface S2 having a lower level than the first upper surface S1.

A first device isolation region 20 may be formed along a sidewall, e.g., left sidewall, of the active fin F22. An upper surface of the first device isolation region 20 may have a third upper surface S3 and a fourth upper surface S4 having a lower level than the third upper surface S3.

A second device isolation region 22 may be formed along a sidewall, e.g., right sidewall, of the active fin 22. An upper surface of the second device isolation region 22 may have a fifth upper surface S5 and a sixth upper surface S6 having a lower level than the fifth upper surface S5.

A polysilicon layer 62 and a mask layer 64 may be formed on the first device isolation region 20, the second device isolation region 22, and the active fin F22.

Figure 17:
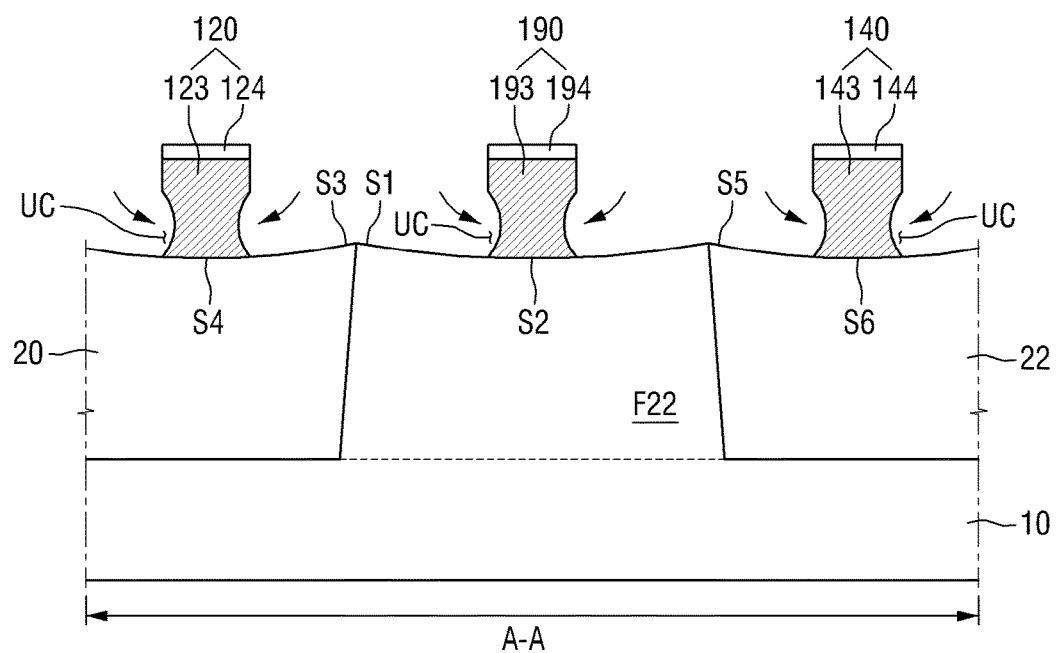

Referring to FIG. 17, the mask layer 64 (shown in FIG. 16) may be patterned to form first through third mask patterns 124, 194, and 144. The polysilicon layer 62 (shown in FIG. 16) may be patterned to form first through third polysilicon gate electrodes 123, 193, and 143 by using the first through third mask patterns 124, 194, 144 as etching masks.

If the first polysilicon gate electrode 123 is formed on the fourth upper surface S4 of the first device isolation region 20, an undercut portion UC may be formed at a lower portion of the first polysilicon gate electrode 123 because the fourth upper surface S4 is lower than the third upper surface S3.

If the second polysilicon gate electrode 193 is formed on the second upper surface S2 of the active fin F22, an undercut portion UC may be also formed at a lower portion of the second polysilicon gate electrode 193 because the second upper surface S2 is lower than the first upper surface S1.

Figure 18:
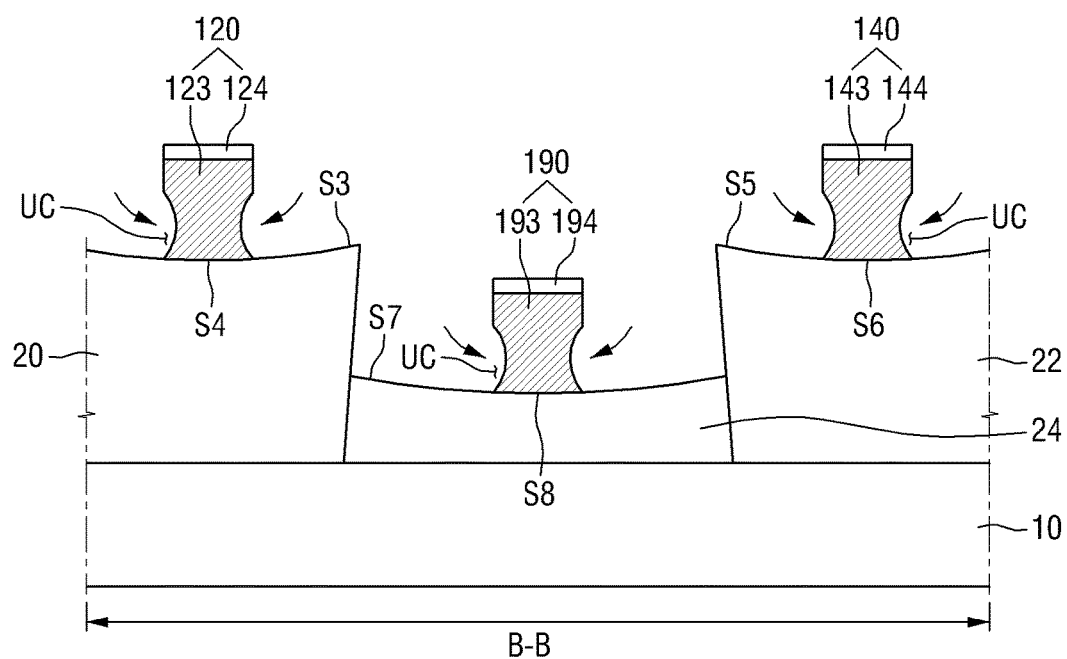

Referring to FIG. 18, if the second polysilicon gate electrode 193 is formed on the eighth upper surface S8 of the field insulating region 24, an undercut portion UC may be formed at a lower portion of the second polysilicon gate electrode 193 because the eighth upper surface S8 is lower than the seventh upper surface S7.

If the third polysilicon gate electrode 143 is formed on the sixth upper surface S6 of the second device isolation region 22, an undercut portion UC may be also formed at a lower portion of the third polysilicon gate electrode 143 because the sixth upper surface S6 is lower than the fifth upper surface S5.

If a gate replacement process is performed to make a transistor with remaining of the undercut portion UC, a width of a metal gate electrode may become shorter and the reliability of the transistor may be worse.

According to an example embodiments, the undercut portion UC may be filled by a filler. Hereinafter, some methods according to the present inventive concepts will be described.

Figure 19:
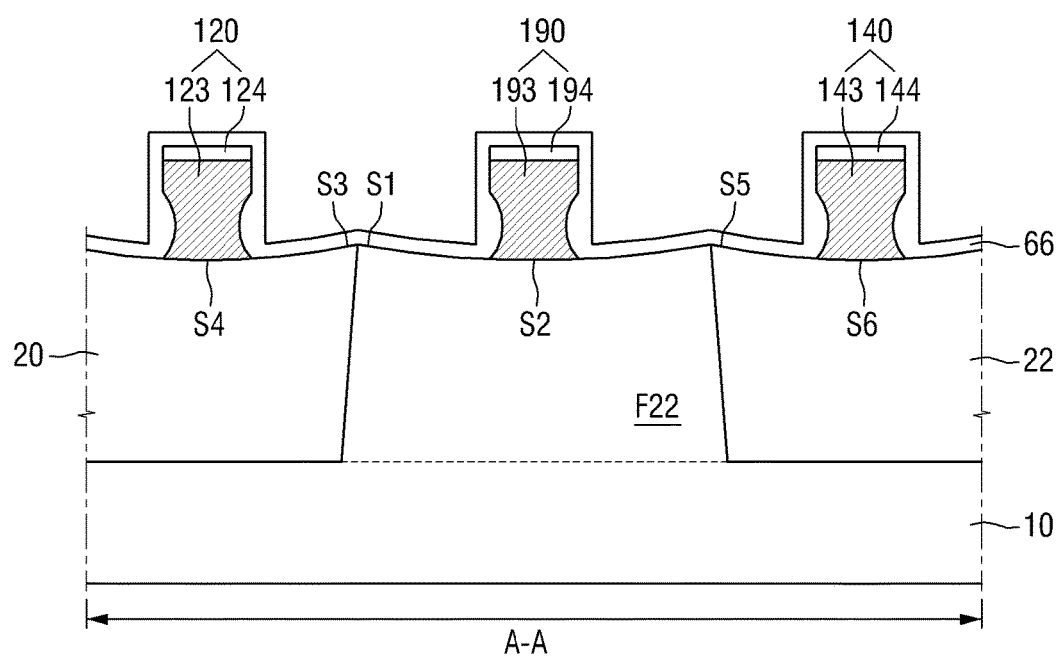

Referring to FIG. 19, a filler layer 66 may be formed on the first device isolation region 20, the second device isolation region 22, the active fin F22, and first through third dummy gate electrodes 120, 140, and 190. The filler layer 66 may be conformally formed on the upper surfaces and the sidewalls of the first device isolation region 20, the second device isolation region 22, the active fin F22, and first through third dummy gate electrodes 120, 140, and 190.

In example embodiments, the filler layer 66 may be a bi-layer structure including a first filler layer and a second filler layer stacked on the first layer. The first filler layer may include a different material from the second filler layer.

In example embodiments, the filler layer 66 may be a multiple layer including more than or equal to three filler layers.

In example embodiments, the filler layer 66 may have an etch selectivity to a plurality of dummy spacers 121 and 141 shown in FIG. 2b. However, it shall not be restricted or limited thereto.

Referring to FIG. 20, the filler layer 66 may be etched to expose upper surfaces of the first through third mask patterns 123, 194, and 144. At this moment, the upper surfaces of the first device isolation region 20, the second and 22, and the active fin F22 may be also exposed. Thereby, the first through third filler 122, 192, and 142, which are fill the undercut portions of the first through third polysilicon gate electrode 123, 193, and 143, may be formed.

In example embodiments, several processes may be performed to form a semiconductor device 1. The processes may comprise forming spacers on the sidewalls of the first through third dummy gate electrodes 120, 190, and 140, replacing the second dummy gate electrodes 140 to a metal gate electrode using a gate replacement process. At this moment, a filler pattern (132 in FIG. 2b) may be formed by partially etching the filler 192 during the gate replacement process.

In example embodiments, in order to form a semiconductor device 2, several processes may be performed to form a semiconductor device 2. The processes may comprise forming spacers on the sidewalls of the first through third dummy gate electrodes 120, 190, and 140, replacing the first through third dummy gate electrodes 120, 190, and 140 to a metal gate electrode, respectively, using a gate replacement process. At this moment, the first through third filler patterns (122a, 132, and 142a in FIG. 5) may be formed by partially etching the first through third filler 122, 192, and 142 during the gate replacement process.

Figure 21:
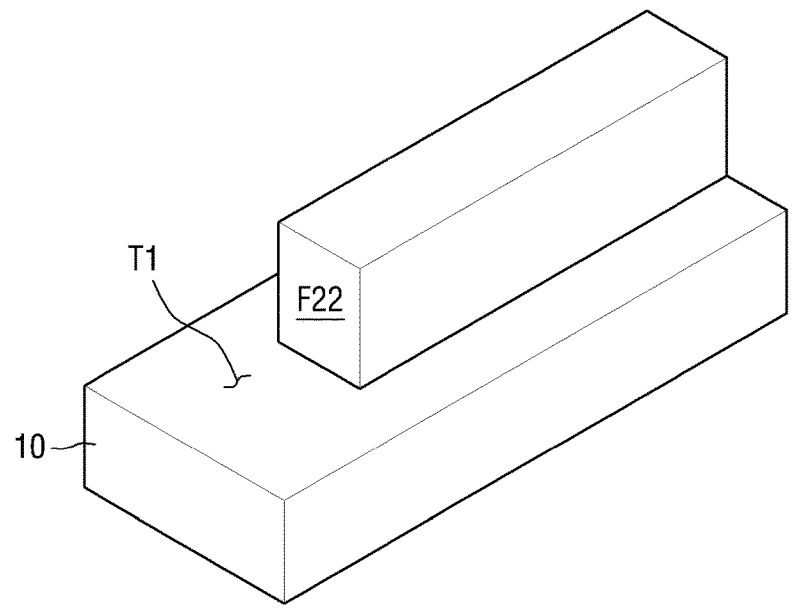
FIGS. 21-24 are perspective views illustrating a method of manufacturing a semiconductor device according to an example embodiment of the inventive concepts.
Figure 24:
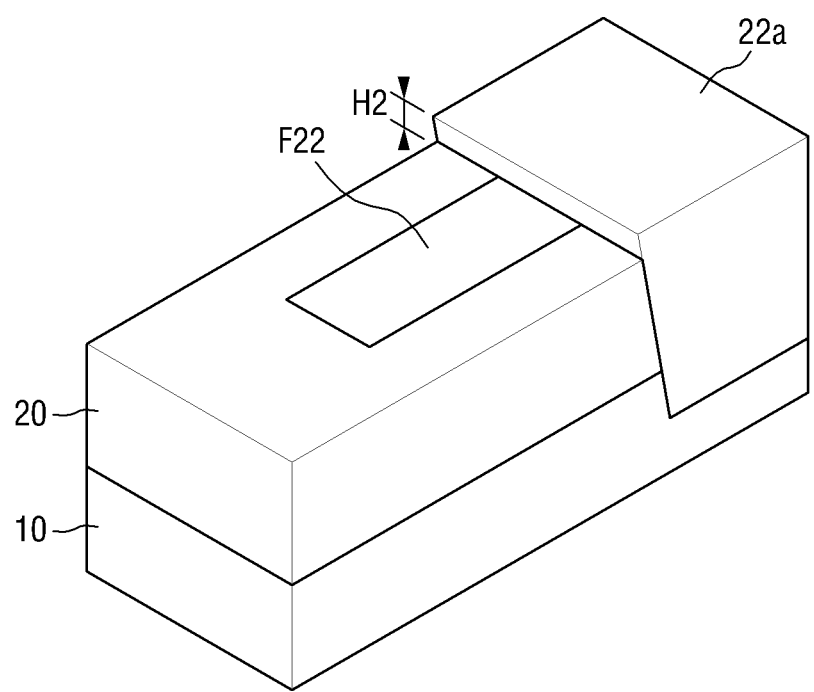

FIGS. 21 and 24 are perspective views illustrating a method of manufacturing a semiconductor device according to an example embodiment of the inventive concepts.

Referring to FIG. 21, an active fin F22 may be formed on a substrate 10. The active fin F22 may be protruded from the substrate 10 and extended in a first direction (X-direction). A first trench T1 may be formed at an end portion of the active fin F22 by etching a portion of the active fin F22. Therefore, an upper surface of the substrate 10 may be exposed by the first trench T1.

Figure 22:
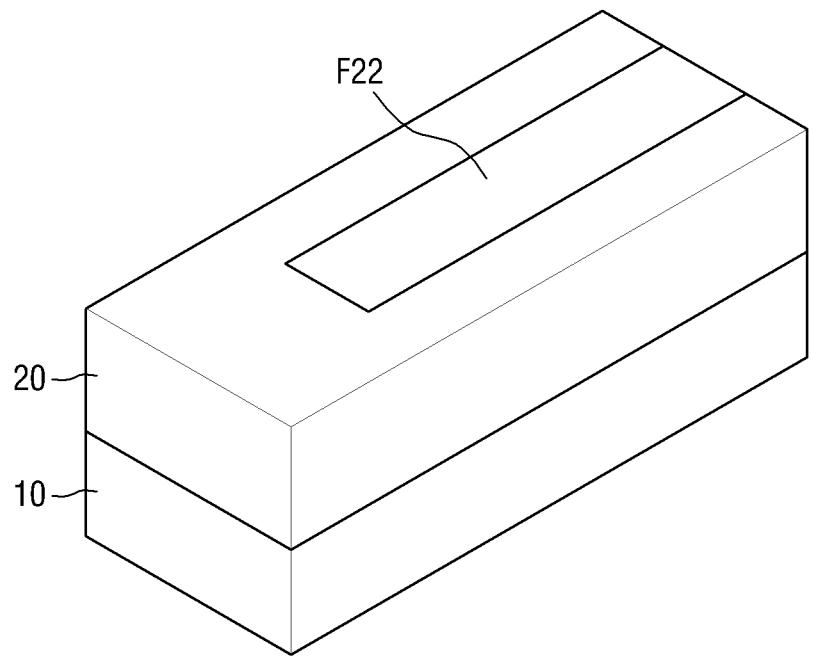

Referring to FIG. 22, a first device isolation region 20 may be formed to fill the first trench T1 and to surround the active fin F22. The first device isolation region 20 may extend in a second direction (Y-direction) which crosses the first direction.

Figure 23:
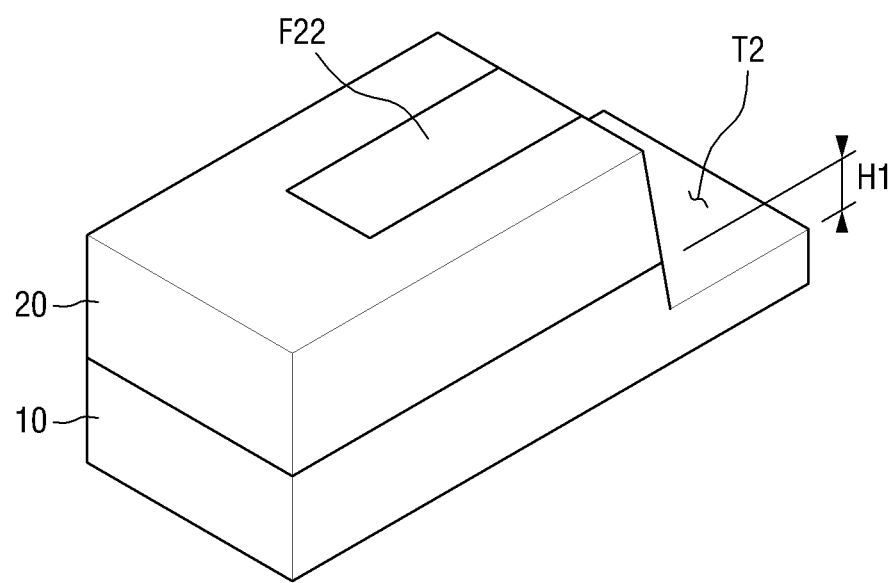

Referring to FIG. 23, a second trench T2 may be formed at the other end portion of the active fin F22 by etching a portion of the active fin F22. A bottom surface of the second trench T2 may be as low as H1 than a bottom surface of the first trench T1. That is, an upper portion of the substrate 10 may be partially etched during the formation of the second trench T2.

Referring to FIG. 24, a second device isolation 22a may be formed to fill the second trench T2. An upper surface of the second device isolation region 22a may be as high as H2 than an upper surface of the active fin F22. Therefore, the upper surface of the second device isolation region 22a may be as high as H2 than the upper surfaces of the first device isolation region and the active fin F22, respectively.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A semiconductor device, comprising:
an active fin protruding from a substrate and extending in a first direction;
a first device isolation region at a sidewall of the active fin and extending in a second direction, the second direction crossing the first direction;
a normal gate electrode crossing the active fin;
a first dummy gate electrode having an undercut portion on the first device isolation region, the first dummy gate electrode extending in the second direction;
a first filler configured to fill the undercut portion of the first dummy gate electrode on the first device isolation region; and
a dummy spacer on a sidewall of the first filler;
wherein a bottom surface of the first dummy gate electrode is in contact with an upper surface of the first device isolation region;
wherein a height of the first filler is equal to a height of the dummy spacer;
wherein the undercut portion of the first dummy gate electrode is at a lower portion of the first dummy gate electrode, and
wherein the first filler extends upward from the upper surface of the first device isolation region along sidewalls of the first dummy gate electrode and the dummy spacer.

2. The semiconductor device of claim 1, wherein the first device isolation region has a first upper surface and a second upper surface having a lower level than the first upper surface; and
wherein the first dummy gate electrode is on the second upper surface.

3. The semiconductor device of claim 2, wherein the first upper surface of the first device isolation region is adjacent to the active fin; and
wherein the second upper surface of the first device isolation region is at a center portion of the first device isolation region.

4. The semiconductor device of claim 1, further comprising a second device isolation region at the sidewall of the active fin and extending in the second direction,
wherein the second device isolation region is opposite to the first device isolation region with the active fin therebetween and has an upper surface higher than the upper surface of the first device isolation region.

5. The semiconductor device of claim 4, further comprising:
a second dummy gate electrode having an undercut portion on the second device isolation region, the second dummy gate electrode extending in the second direction; and
a second filler filling the undercut portion of the second dummy gate electrode on the second device isolation region.

6. The semiconductor device of claim 4, wherein a bottom surface of the second device isolation region is lower than a bottom surface of the first device isolation region.

7. The semiconductor device of claim 4, wherein a bottom surface of the second device isolation region is lower than a bottom surface of the active fin.

8. The semiconductor device of claim 4, wherein the active fin comprises a first active fin and a second active fin extending in parallel with the first active fin, the first and second active fins being spaced apart from each other by a distance,
wherein a length of a long side of the first active fin is greater than a length of a long side of the second active fin, and
wherein the second dummy gate electrode overlaps the first active fin and does not overlap the second active fin.

9. The semiconductor device of claim 4, wherein the active fin comprises a first active fin and a second active fin, the first and second active fins being spaced apart from each other by a distance,
wherein a length of a long side of the first active fin is greater than a length of a long side of the second active fin, and
wherein the second device isolation region is adjacent to the long side of the first active fin and to a short side of the second active fin.

10. The semiconductor device of claim 1,
wherein the first filler has a material having an etch selectivity that is different than an etch selectivity of the dummy spacer.

11. The semiconductor device of claim 1, wherein the first dummy gate electrode comprises a polysilicon gate electrode that includes the undercut portion and a mask layer pattern on the polysilicon gate electrode.

12. The semiconductor device of claim 1, wherein the active fin has a first upper surface and a second upper surface having a lower level than the first upper surface, and
wherein the normal gate electrode is at the second upper surface of the active fin.

13. A semiconductor device, comprising:
an active fin protruding from a substrate and extending in a direction;
a device isolation region at a sidewall of the active fin;
a normal gate electrode crossing the active fin;
a normal spacer at a sidewall of the normal gate electrode;
a gate dielectric layer along a bottom surface of the normal gate electrode and along a sidewall of the normal spacer;
a filler pattern such that the gate dielectric layer is between the filler pattern and the normal gate electrode;
a dummy gate electrode on the device isolation region having an undercut portion at a lower portion of the dummy gate electrode,
wherein a bottom surface of the dummy gate electrode is in contact with an upper surface of the device isolation region
a filler on the device isolation region filling the undercut portion, and
a dummy gate spacer on a sidewall of the filler;
wherein a bottom surface of the dummy gate electrode is in contact with an upper surface of the device isolation region;
wherein a height of the filler is equal to a height of the dummy gate spacer, and
wherein the filler pattern is between the normal spacer and the gate dielectric layer.

14. The semiconductor device of claim 13, wherein the filler pattern extends upward along the sidewall of the normal spacer.

15. The semiconductor device of claim 13, wherein the filler pattern comprises a silicon oxynitride layer.

16. The semiconductor device of claim 13, wherein the active fin has a first upper surface and a second upper surface having a lower level than the first upper surface, and wherein the normal gate electrode is at the second upper surface.

17. The semiconductor device of claim 16, wherein the first upper surface of the active fin is adjacent to the device isolation region; and wherein the second upper surface of the active fin is at a center portion of the active fin.

18. The semiconductor device of claim 13, wherein the active fin comprises a first active fin and a second active fin extending in parallel with the first active fin, the first and second active fins being spaced apart from each other by a distance, and wherein the dummy gate electrode overlaps the first active fin and does not overlap the second active fin.

19. The semiconductor device of claim 13, wherein the upper surface of the device isolation region has a higher level than an upper surface of the active fin.

20. The semiconductor device of claim 19, wherein a bottom surface of the device isolation region has a lower level than a bottom surface of the active fin.

* * * * *